(12) United States Patent
Kawahito et al.

(10) Patent No.: US 7,843,029 B2
(45) Date of Patent: Nov. 30, 2010

(54) SEMICONDUCTOR RANGE-FINDING ELEMENT AND SOLID-STATE IMAGING DEVICE

(75) Inventors: Shoji Kawahito, Hamamatsu (JP); Takashi Watanabe, Kizukawa (JP)

(73) Assignees: National University Corporation Shizuoka University, Shizuoka-shi (JP); Sharp Kabushiki Kaisha, Osaka-shi (JP)

( * ) Notice: Subject to any disclaimer, the term of this patent is extended or adjusted under 35 U.S.C. 154(b) by 225 days.

(21) Appl. No.: 12/295,443

(22) PCT Filed: Mar. 30, 2007

(86) PCT No.: PCT/JP2007/057275

§ 371 (c)(1), (2), (4) Date: Sep. 30, 2008

(87) PCT Pub. No.: WO2007/119626

PCT Pub. Date: Oct. 25, 2007

(65) Prior Publication Data

US 2009/0114919 A1 May 7, 2009

(30) Foreign Application Priority Data

Mar. 31, 2006 (JP) ............................. P2006-099859

(51) Int. Cl.
*H01L 31/10* (2006.01)
*H01L 27/148* (2006.01)

(52) U.S. Cl. .................. 257/461; 257/431; 257/443; 257/59

(58) Field of Classification Search .................. 257/59, 257/222, 235, 431, 461, E27.15, E31.053
See application file for complete search history.

(56) References Cited

U.S. PATENT DOCUMENTS 6,825,455 B1 * 11/2004 Schwarte ................. 250/214.1

| 6,876,019 | B2 * | 4/2005 | Shinohara | 257/292 |
| 7,436,496 | B2 * | 10/2008 | Kawahito | 356/5.01 |
| 7,671,391 | B2 * | 3/2010 | Kawahito | 257/290 |

(Continued)

FOREIGN PATENT DOCUMENTS

| JP | 2000 517427 | 12/2000 |
| JP | 2004 294420 | 10/2004 |
| JP | 2005 235893 | 9/2005 |

OTHER PUBLICATIONS

U.S. Appl. No. 12/516,635, filed May 28, 2009, Kawahito.
Sawada, T. et al., "A QVGA-size CMOS Time-of-Flight range image sensor with background light charge draining structure" ITE Technical Report, vol. 30, No. 25, pp. 13-16, (2006) (with English abstract).
Miyagawa, R. et al., CCD-Based Range-Finding Sensor, IEEE Transactions on Electron Devices, vol. 44, No. 10, pp. 1648-1652, (1997).

*Primary Examiner*—Leonardo Andújar
*Assistant Examiner*—Jordan Klein
(74) *Attorney, Agent, or Firm*—Oblon, Spivak, McClelland, Maier & Neustadt, L.L.P.

(57) ABSTRACT

A semiconductor range-finding element and a solid-state imaging device, which can provide a smaller dark current and a removal of reset noise. With n-type buried charge-generation region, buried charge-transfer regions, buried charge read-out regions buried in a surface of p-type semiconductor layer, an insulating film covering these regions, transfer gate electrodes arranged on the insulating film for transferring the signal charges to the buried charge-transfer regions, read-out gate electrodes arranged on the insulating film for transferring the signal charges to the buried charge read-out regions, after receiving a light pulse by the buried charge-generation region, in the semiconductor layer just under the buried charge-generation region, an optical signal is converted into signal charges, and a distance from a target sample is determined by a distribution ratio of the signal charges accumulated in the buried charge-transfer regions.

22 Claims, 14 Drawing Sheets

U.S. PATENT DOCUMENTS

| | | |
|---|---|---|
| 2006/0192938 A1 | 8/2006 | Kawahito |
| 2008/0277700 A1* | 11/2008 | Kawahito .................. 257/292 |
| 2009/0134396 A1* | 5/2009 | Kawahito et al. ............. 257/72 |
| 2009/0230437 A1* | 9/2009 | Kawahito et al. ........... 257/226 |

* cited by examiner

FIG. 4
(a)
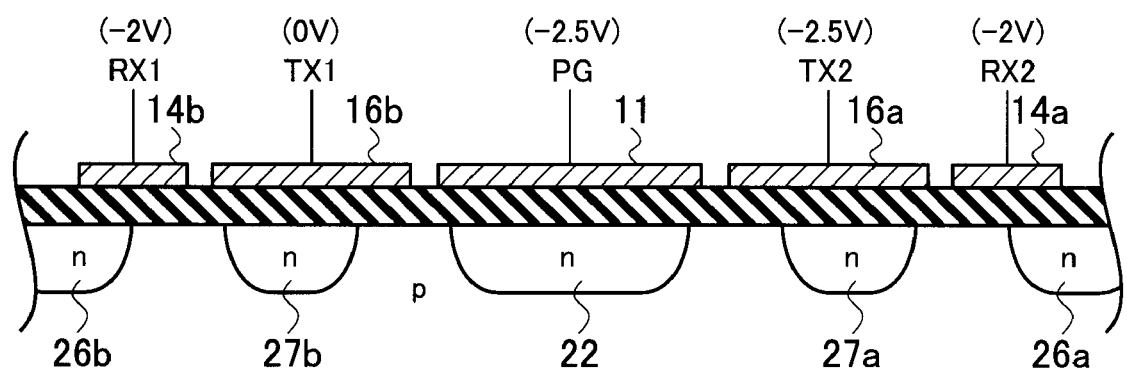
(b)
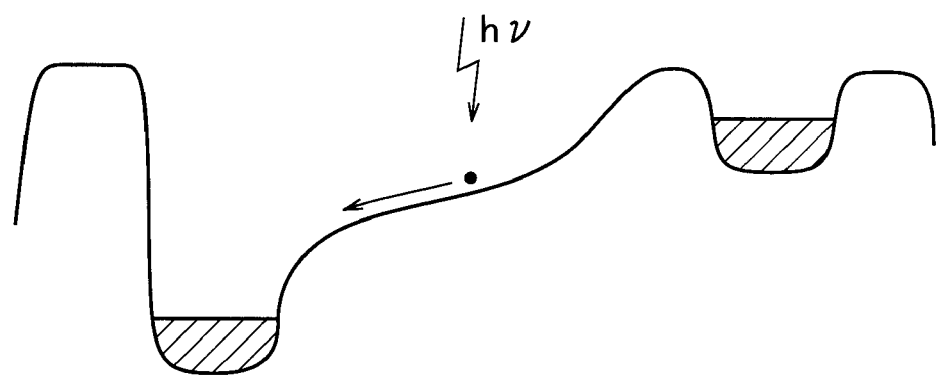

FIG. 5
(a)
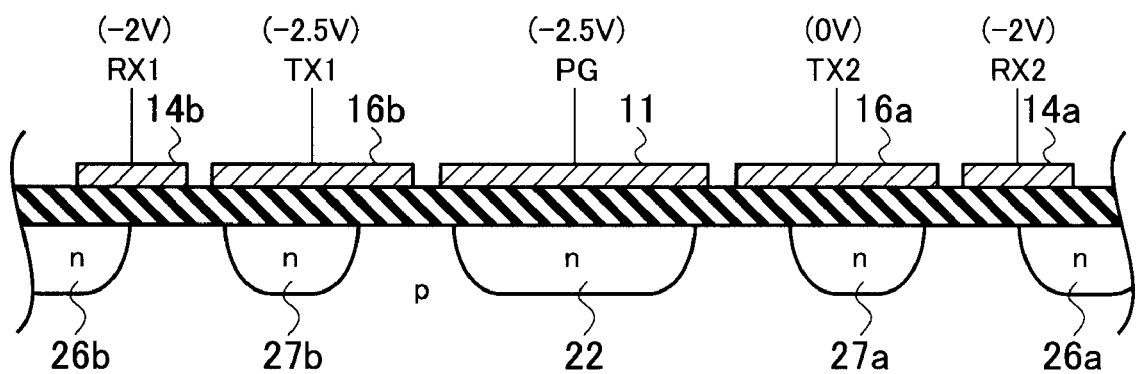
(b)
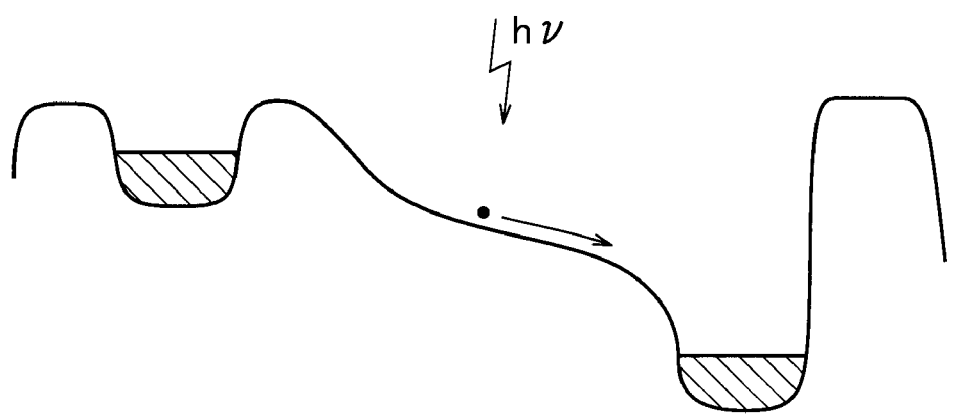

FIG. 10
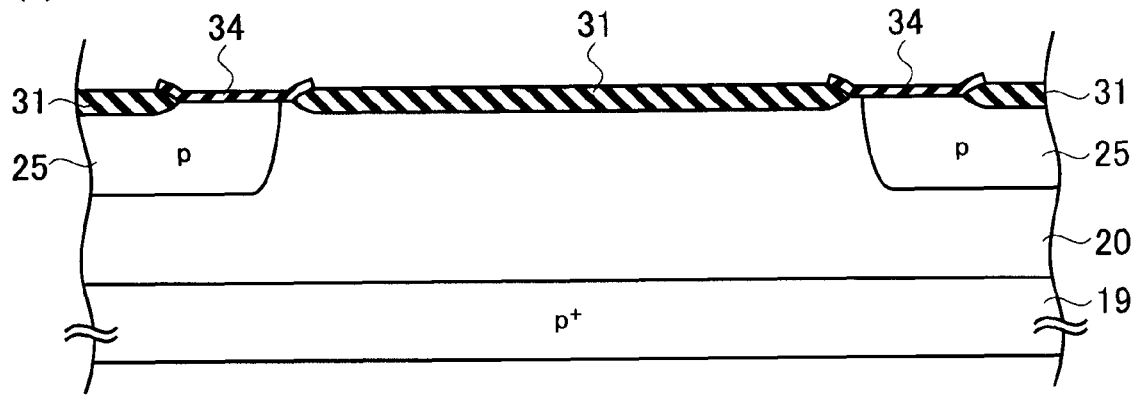
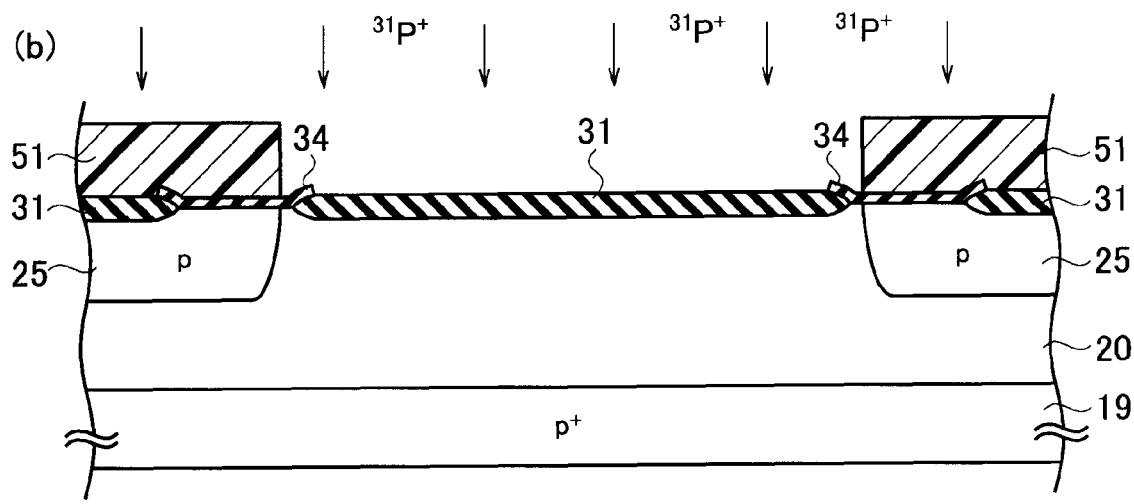
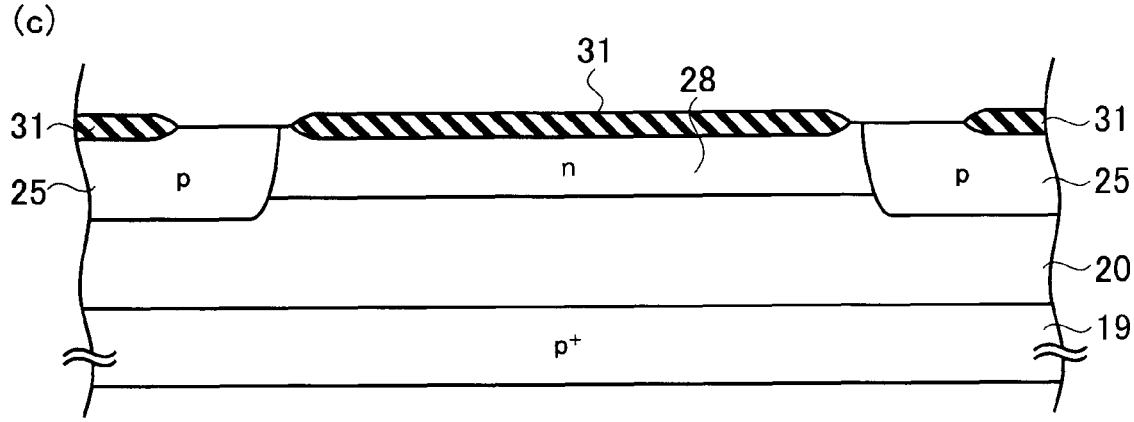

FIG. 13
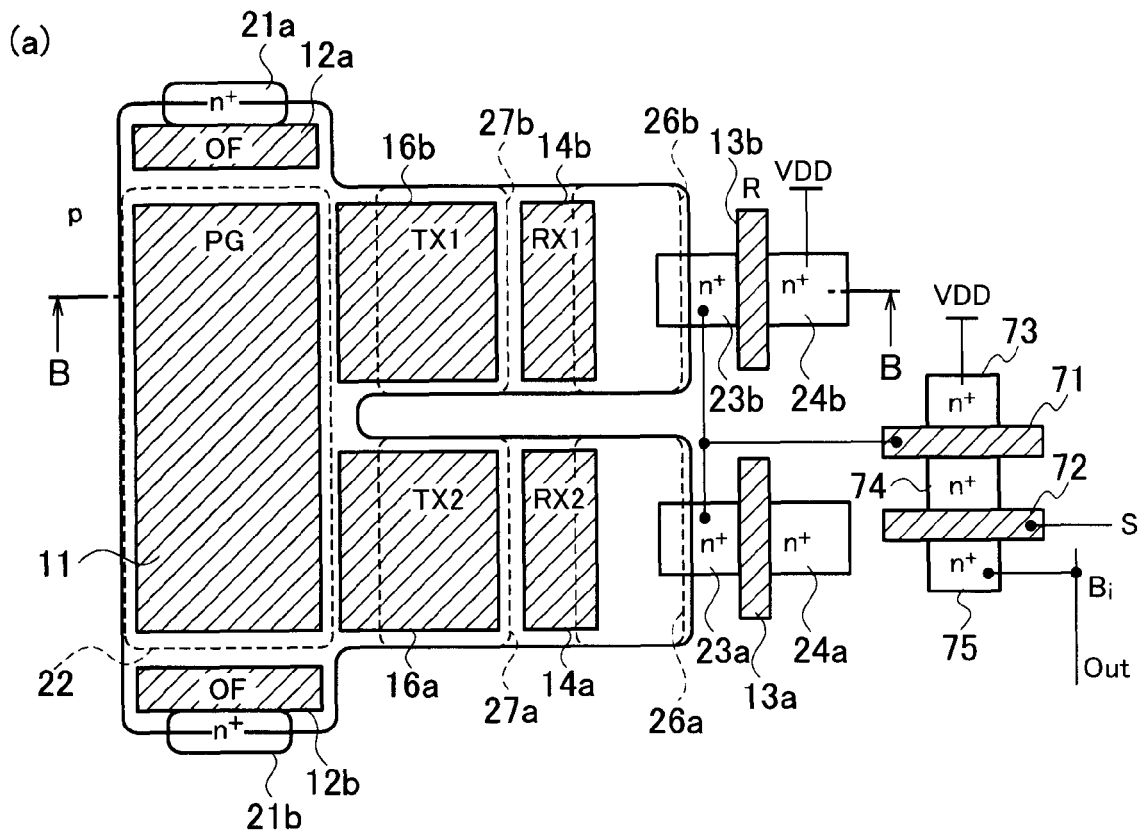
(a)
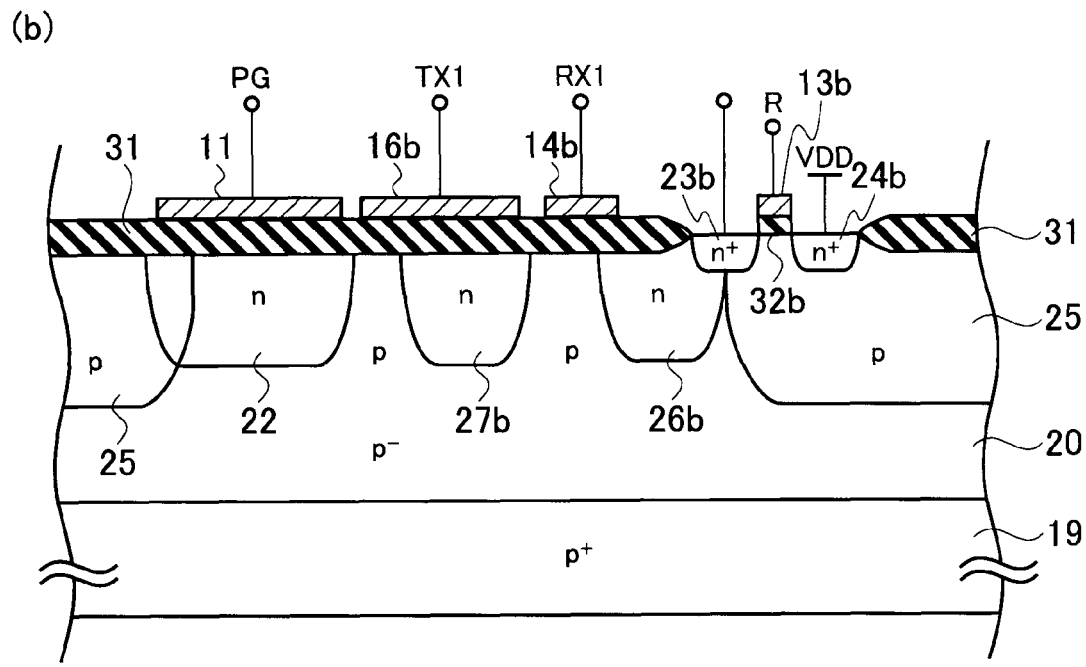
(b)

FIG. 14
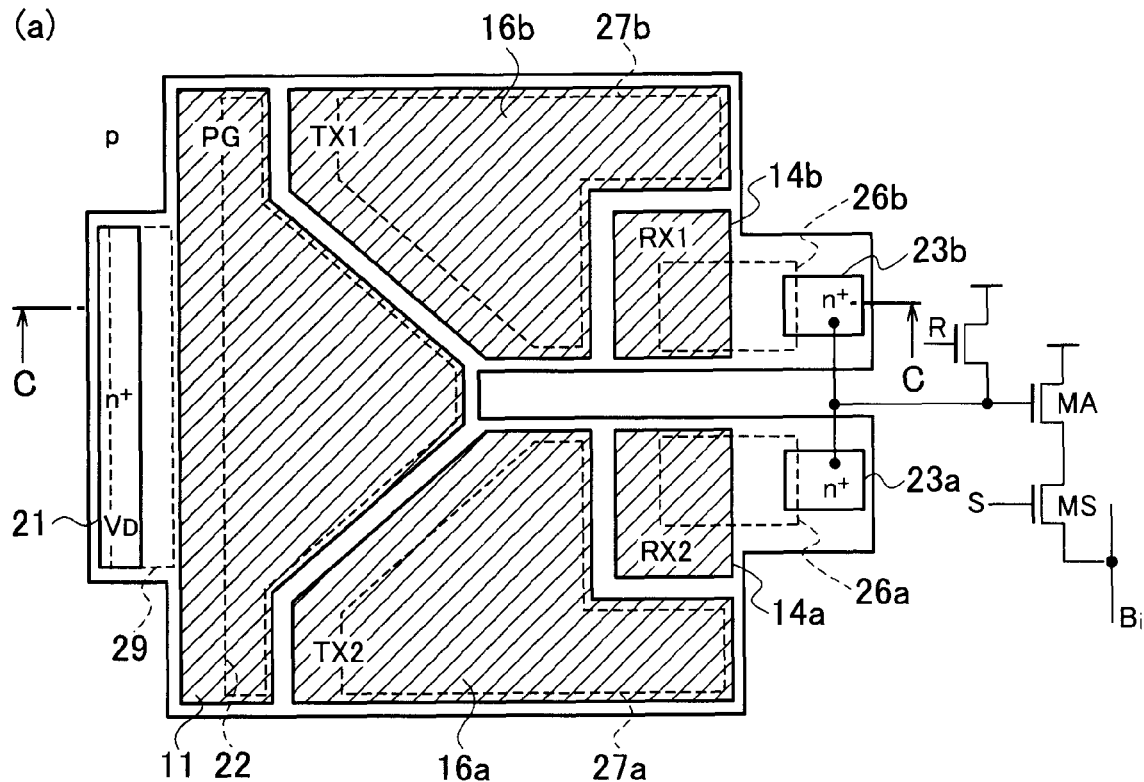
(a)
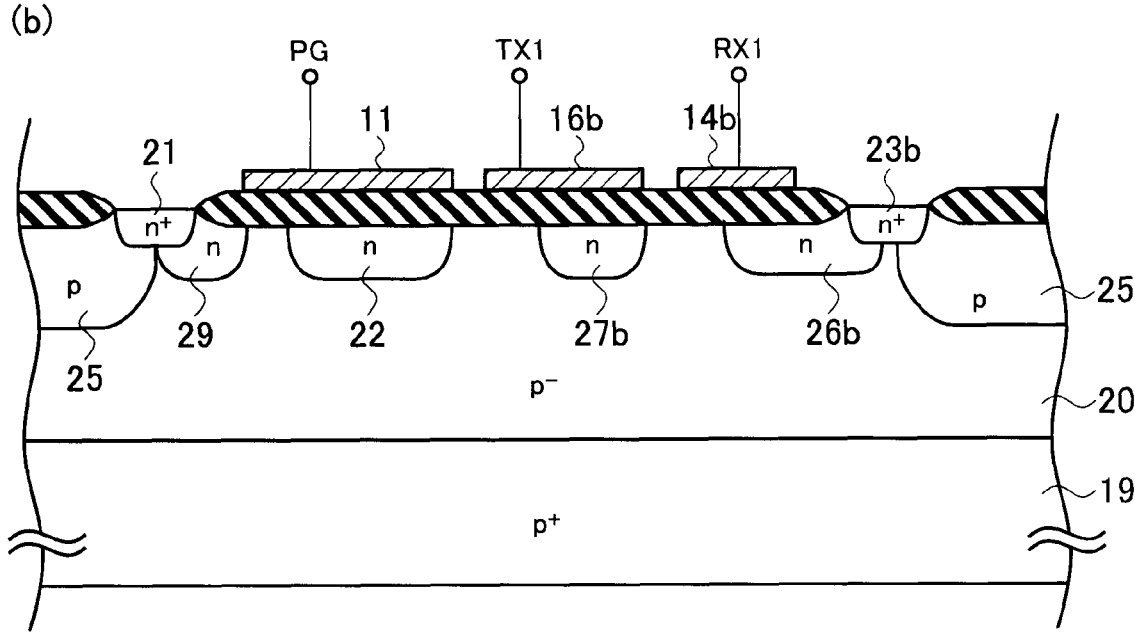
(b)

SEMICONDUCTOR RANGE-FINDING ELEMENT AND SOLID-STATE IMAGING DEVICE

FIELD OF THE INVENTION

The present invention relates to a semiconductor range-finding element and a solid-state imaging device in which a plurality of semiconductor range-finding elements are arrayed.

DESCRIPTION OF THE RELATED ART

As reported by R. Miyagawa et al., "CCD-Based Range-Finding Sensor", IEEE Transaction on Electron Devices, October 1997, Vol. 44, No. 10, pp. 1648-1652, with a pioneering report of one-dimensional CCD range-finding sensor, which has been firstly reported in 1997, the development of time-of-flight (TOF) type range-finding sensors using time-of-flight of light and obtaining range images are advancing in many fields.

However, the resolution of the currently available TOF type range-finding sensor remains within about 20,000 pixels. Also, in the case of a method of using the CCD, as the number of the pixels is increased, it becomes difficult to drive the pixels. In the method of using the mixture process of CMOS and CCD, its manufacturing cost becomes expensive.

In view of such circumstances, one of the inventors of the present invention already proposed the method based on the CMOS technique that was effective for attaining a higher sensitivity and carrying out a charge transfer at a high speed, as described in JP 2004-294420A. Moreover, the one of the inventors of the present invention developed the method disclosed in JP 2004-294420A and also proposed a range-finding image sensor having a simple structure in which a gate electrode was formed on a field oxide film, which is used in an architecture of CMOS integrated circuits, as described in JP 2005-235893A.

SUMMARY OF THE INVENTION

However, in an approach of the method of using, as an active layer, the semiconductor layer under the field oxide film proposed in JP 2005-235893A, a dark current was large, and the reduction of the dark current was a problem to be solved.

Also, in an approach of accumulating the charges in the floating diffusion layer such as the structure proposed in JP 2004-294420A, the approach had problems such that reset noise could not be removed, a random noise level was high, and the performance deterioration was severe in the region in which light quantity was small.

It is therefore an object of the present invention to provide a semiconductor range-finding element that can be manufactured at a low manufacturing cost and is superior in low noise performance which is achieved by a smaller dark current and a removal of reset noise, and further to provide a solid-state imaging device that uses the semiconductor range-finding element as one of a plurality of pixels and has a high distance resolution and a space resolution.

In view of above-mentioned objects, a first aspect of the present invention inheres in a semiconductor range-finding element encompassing (a) a semiconductor layer of first conductivity type, (b) an island-shaped buried charge-generation region of second conductivity type buried in a part of a surface of the semiconductor layer, (c) island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region, (d) an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region, (e) an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region, (f) an insulating film covering the semiconductor layer, the buried charge-generation region, the first and second buried charge-transfer regions, and the first and second buried charge read-out regions, (g) first and second transfer gate electrodes arranged on the insulating film, configured to electrostatically control potentials of transfer channels formed between the buried charge-generation region and the first buried charge-transfer region and between the buried charge-generation region and the second buried charge-transfer region, respectively, through the insulating film, so as to alternately transfer the signal charges to the first and second buried charge-transfer regions, and (h) first and second read-out gate electrodes arranged on the insulating film, configured to electrostatically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out regions. Then, a light pulse reflected by a target sample enters as an optical signal in the buried charge-generation region, and in the semiconductor layer just under the buried charge-generation region, the optical signal is converted into the signal charges, and pulse signals are sequentially applied to the first and second transfer gate electrodes in synchronization with the light pulse so that a distance from the target sample is measured in accordance with a distribution ratio of the signal charges accumulated in the first and second buried charge-transfer regions. Here, the first conductivity type and the second conductivity type are opposite to each other. That is, when the first conductivity type is the n-type, the second conductivity type is the p-type, and when the first conductivity type is the p-type, the second conductivity type is the n-type. As "the insulating film", a silicon oxide film ($SiO_2$ film) is preferable. However, the use of various insulating films other than the silicon oxide film ($SiO_2$ film) is not inhibited. That is, the first and second transfer gate electrodes typically have the insulating gate structure of an insulated gate transistor (MIN transistor) having the various insulating films. For example, with ONO film implemented by the triple-level film of silicon oxide film ($SiO_2$ film)/silicon nitride film ($Si_3N_4$ film)/silicon oxide film ($SiO_2$ film), a dielectric constant of about $\epsilon_r$=5 to 5.5 is obtained. Moreover, the single level film made of any one of a strontium oxide (SrO) film of $\epsilon_r$=6, a silicon nitride ($Si_3N_4$) film of $\epsilon_r$=7, an aluminum oxide ($Al_2O_3$) film of $\epsilon_r$=8 to 11, a magnesium oxide (MgO) film of $\epsilon_r$=10, a yttrium oxide ($Y_2O_3$) film of $\epsilon_r$=16 to 17, a hafnium oxide ($HfO_2$) film of $\epsilon_r$=22 to 23, a zirconium oxide ($ZrO_2$) film of $\epsilon_r$=22 to 23, a tantalum oxide ($Ta_2O_5$) film of $\epsilon_r$=25 to 27, and a bismuth oxide ($Bi_2O_3$) film of $\epsilon_r$=40, or the composite film in which a plurality of foregoing materials are laminated can be used as the gate insulating film of the MIS transistor. $Ta_2O_5$ and $Bi_2O_3$ are lacking in thermal stability on the interface with poly-crystalline silicon (by the way, since the foregoing values of the exemplified respective dielectric constants $\in_r$ may be changed depending on the manufacturing method, and may depart from those values, depending on a case). Moreover, the gate insulating film may be implemented by a combination of one of those composite films and the silicon oxide film. The composite film may have the lamination structure of triple-level or more. That is, at least, the gate insulating film that partially includes the material having the foregoing dielectric constant $\in_r$ of 5 to 6 or more is preferred. However, in the case of the composite film, it is preferred to select a combination in which the effective dielectric constant $\in_{ref}$ measured as the entire gate insulating film is 5 to 6 or more. Also, the gate insulating film made of ternary-alloy compound such as a hafnium aluminate (HfAlO) film may be used. That is, the oxide, which at least includes any one element of strontium (Sr), Aluminum (Al), magnesium (Mg), yttrium (Y), hafnium (Hf), zirconium (Zr), tantalum (Ta) and bismuth (Bi), or the silicon nitride, which includes those elements, can be used as the gate insulating film. By the way, ferroelectric material such as strontium titanate ($SrTiO_3$) of barium strontium titanate ($BaSrTiO_3$) can be used as the gate insulating film of a high dielectric constant. However, the lack of the thermal stability on the interface with the poly-crystalline silicon and the hysteresis characteristic of the ferroelectric material are required to be considered.

A second aspect of the present invention inheres in a semiconductor range-finding element encompassing (a) a semiconductor layer of first conductivity type, (b) a surface buried region of second conductivity type buried in a surface of the semiconductor layer, (c) island-shaped first and second charge transfer-barrier regions of the first conductivity type buried in a part of a surface of the surface buried region, (d) an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region, (e) an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region, (f) an insulating film covering the surface buried region, the first and second charge transfer-barrier regions, and the first and second charge read-out barrier regions, (g) first and second transfer gate electrodes arranged on the insulating film, configured to electrostatically control potentials of transfer channels formed in the first and second charge transfer-barrier regions, respectively, through the insulating film, so as to alternately transfer the signal charges to the first and second potential wells, and (h) first and second read-out gate electrodes arranged on the insulating film, configured to electrostatically control potentials of transfer channels formed in the first and second charge read-out barrier regions, respectively, through the insulating film. Then, a light pulse reflected by a target sample enters as an optical signal in the surface buried region between the first and second charge transfer-barrier regions, and in the semiconductor layer just under the surface buried region, the optical signal is converted into the signal charges, and pulse signals are sequentially applied to the first and second transfer gate electrodes in synchronization with the light pulse so that a distance from the target sample is measured in accordance with a distribution ratio of the signal charges accumulated in the first and second potential wells.

A third aspect of the present invention inheres in a solid-state imaging device including a plurality of pixels arrayed in a one-dimensional direction, wherein each of the pixels encompasses (a) a semiconductor layer of first conductivity type, (b) an island-shaped buried charge-generation region of second conductivity type buried in a part of a surface of the semiconductor layer, (c) island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region, (d) an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region, (e) an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region, (f) an insulating film covering the semiconductor layer, the buried charge-generation region, the first and second buried charge-transfer regions, and the first and second buried charge read-out regions, (g) first and second transfer gate electrodes arranged on the insulating film, configured to electrostatically control potentials of transfer channels formed between the buried charge-generation region and the first buried charge-transfer region and between the buried charge-generation region and the second buried charge-transfer region, respectively, through the insulating film, so as to alternately transfer the signal charges to the first and second buried charge-transfer regions, and (h) first and second read-out gate electrodes arranged on the insulating film, configured to electrostatically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out regions. Then, pulse signals are sequentially applied to the first and second transfer gate electrodes in all of the pixels arrayed in the one-dimensional direction, in synchronization with light pulse, a distance from the target sample is measured in accordance with a distribution ratio of the signal charges accumulated in the first and second buried charge-transfer regions in each of pixels.

A fourth aspect of the present invention inheres in a solid-state imaging device including a plurality of pixels arrayed in a one-dimensional direction, wherein each of the pixels encompasses (a) a semiconductor layer of first conductivity type, (b) a surface buried region of second conductivity type buried in a surface of the semiconductor layer, (c) island-shaped first and second charge transfer-barrier regions of the first conductivity type buried in a part of a surface of the surface buried region, (d) an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region, (e) an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region, (f) an insulating film covering the surface buried region, the first and second charge transfer-barrier regions, and the first and second charge read-out barrier regions, (g) first and second transfer gate electrodes arranged on the insulating film, configured to electrostatically control potentials of transfer channels formed in the first and second charge transfer-barrier regions, respectively, through the insulating film, so as to alternately transfer the signal charges to the first and second potential wells, and (h) first and second read-out gate electrodes arranged on the insulating film, configured to electrostatically control potentials of transfer channels formed in the first and second charge read-out barrier regions, respectively, through the insulating film. Then, pulse signals are sequentially applied to the first and second transfer gate electrodes in synchronization with light pulse, and a distance from the target sample is measured in accordance with a distribution ratio of the signal charges accumulated in the first and second potential wells in each of the pixels arrayed in the one-dimensional direction.

A fifth aspect of the present invention inheres in a solid-state imaging device including a plurality of pixels arrayed in a two-dimensional matrix, wherein each of the pixels encompasses (a) a semiconductor layer of first conductivity type, (b) an island-shaped buried charge-generation region of second conductivity type buried in a part of a surface of the semiconductor layer, (c) island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region, (d)

an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region, (e) an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region, (f) an insulating film covering the semiconductor layer, the buried charge-generation region, the first and second buried charge-transfer regions, and the first and second buried charge read-out region, (g)

first and second transfer gate electrodes arranged on the insulating film, configured to electrostatically control potentials of transfer channels formed between the buried charge-generation region and the first buried charge-transfer region and between the buried charge-generation region and the second buried charge-transfer region, through the insulating film, so as to alternately transfer the signal charges to the first and second buried charge-transfer regions, and (h) first and second read-out gate electrodes arranged on the insulating film, configured to electro-statically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out region. Then, pulse signals are sequentially applied to the first and second transfer gate electrodes, in synchronization with light pulse, and a distance from the target sample is measured in accordance with a distribution ratio of the signal charges accumulated in the first and second buried charge-transfer regions in each of the pixels arrayed in the two-dimensional matrix so that all of the pixels are two-dimensionally accessed, and a two-dimensional picture corresponding to the measured distance is consequently obtained.

A sixth aspect of the present invention inheres in a solid-state imaging device including a plurality of pixels arrayed in a two-dimensional matrix, wherein each of the pixels encompasses (a) a semiconductor layer of first conductivity type, (b) a surface buried region of second conductivity type buried in a surface of the semiconductor layer, (c)

island-shaped first and second charge transfer-barrier regions of the first conductivity type buried in a part of a surface of the surface buried region, (d) an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region, (e) an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region, (f)

an insulating film covering the surface buried region, the first and second charge transfer-barrier regions, and the first and second charge read-out barrier regions, (g) first and second transfer gate electrodes arranged on the insulating film, configured to electrostatically control potentials of transfer channels formed in the first and second charge transfer-barrier regions, respectively, through the insulating film, so as to alternately transfer the signal charges to the first and second potential wells, and (h) first and second read-out gate electrodes arranged on the insulating film, configured to electrostatically control potentials of transfer channels formed in the first and second charge read-out barrier regions, respectively, through the insulating film. Then, pulse signals are sequentially applied to the first and second transfer gate electrodes, in synchronization with light pulse, and a distance from the target sample is measured in accordance with a distribution ratio of the signal charges accumulated in the first and second potential wells, in each of the pixels arrayed in the two-dimensional matrix, so that all of the pixels are two-dimensionally accessed, and a two-dimensional image corresponding to the measured distance is consequently obtained.

BRIEF DESCRIPTION OF THE DRAWINGS

FIG. 4 is a schematic view explaining a potential distribution when a pulse signal TX1=0 V is applied to a first transfer gate electrode and when a pulse signal TX2=−2.5 V is applied to a second transfer gate electrode, and a behavior of a transfer of signal charges to a first buried charge-transfer region;

FIG. 5 is a schematic view explaining a potential distribution when a pulse signal TX2=0 V is applied to a second transfer gate electrode and when a pulse signal TX1=−2.5 V is applied to a first transfer gate electrode, and a behavior of a transfer of signal charges to a second buried charge-transfer region;

FIG. 9 (b) shows a potential diagram of the case shown in FIG. 9 (a) and describes a trouble in which a barrier is generated in an A-portion surrounded with a dashed circle;

FIG. 10 is a step sectional view (No. 1) describing the manufacturing method of the semiconductor range-finding element and solid-state imaging device, pertaining to the second embodiment of the present invention;

FIG. 13 (a) is a schematic plan view describing a configuration of a semiconductor range-finding element serving as a part of pixels in a solid-state imaging device, according to a third embodiment of the present invention;

FIG. 13 (b) is a schematic sectional view when it is viewed from the B-B direction of FIG. 13 (a);

FIG. 14 (a) is a schematic plan view describing a configuration of a semiconductor range-finding element serving as a part of pixels in a solid-state imaging device, according to a fourth embodiment of the present invention; and FIG. 14 (b) is a schematic sectional view when it is viewed from the C-C direction of FIG. 14 (a).

DETAILED DESCRIPTION OF THE INVENTION

Figure 1:
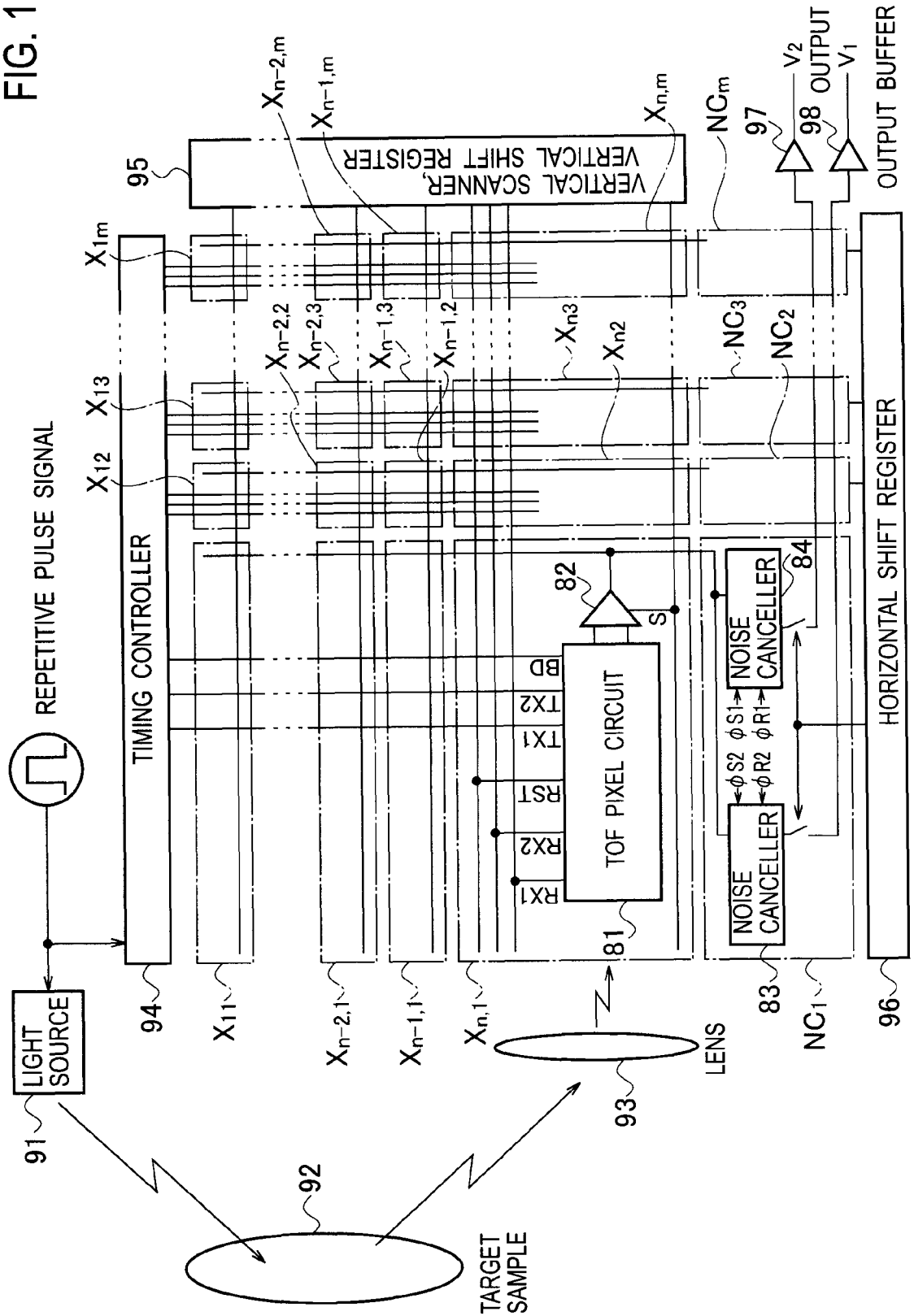
FIG. 1 is a schematic plan view describing a layout of a solid-state imaging device (two-dimensional image sensor) on a semiconductor chip according to a first embodiment of the present invention.

First to fourth embodiments of the present invention will be described below with reference to the drawings. In the notifications of the following drawings, the same or similar reference numerals are applied to the same or similar parts and elements throughout the drawings. However, attention should be paid to the fact that the drawings are only diagrammatic, and the relation between a thickness and a planar dimension, a rate between thicknesses of respective layers, and the like may be different from actual values. Thus, the specific thicknesses and dimensions should be construed by referring to the following descriptions. Also, it is natural that a portion in which a mutual relation between the dimensions or a rate of the dimensions is different between the drawings might be included.

Also, the following first to fourth embodiments only exemplify devices and methods that embody the technical idea of the present invention. In the technical idea of the present invention, the materials, shapes, structures, arrangements and the like of the configuration parts are not limited to the following items. Various modifications can be applied to the technical idea of the present invention, within the technical range described in claims. For example, in the following descriptions of the first and second embodiments, a first conductivity type is assigned as a p-type, and a second conductivity type is assigned as an n-type. However, a person of ordinary skill in the art would easily understood that the first conductivity type can be assigned as the n-type and the second conductivity type can be assigned as the p-type, when the electric polarities are reversed, so as to achieve the similar effectiveness.

First Embodiment

In a solid-state imaging device (two-dimensional image sensor) according to a first embodiment of the present invention, as shown in FIG. 1, a pixel array area ($X_{11}$ to $X_{1m}$, $X_{21}$ to $X_{2m}$, - - - $X_{n1}$ to $X_{nm}$) and peripheral circuit areas (94, 95, 96, and $NC_1$ to $NC_m$) are merged on a same semiconductor chip. A large number of pixels $X_{ij}$ (i=1 to m, j=1 to n, and the m, n are integers, respectively) are two-dimensionally arrayed in the pixel array area, and a rectangular imaging area is established. Then, a timing controller 94 is provided on the upper side of the pixel array area, and a horizontal shift register 96 is provided on the lower side, respectively along pixel rows $X_{11}$ to $X_{1m}$, $X_{21}$ to $X_{2m}$, - - - , $X_{n1}$ to $X_{nm}$ directions. On the right side of the pixel array area, a vertical shift register and a vertical scanning circuit 95 are provided along pixel columns $X_{11}$ to $X_{n1}$, $X_{12}$ to $X_{n2}$, - - - , $X_{1j}$ to $X_{nj}$, - - - $X_{1m}$ to $X_{nm}$ directions. As an inner structure of the pixel $X_{nj}$ is representatively illustrated, each pixel $X_{ij}$ is implemented by a TOF pixel circuit 81, which embraces a semiconductor photoelectric conversion element and a charge transferring element, and a voltage-read-out buffer amplifier 82.

A plurality of the pixels $X_{ij}$ in the inside of the pixel array area are sequentially scanned by the timing controller 94, the horizontal shift register 96 and the vertical shift register and vertical scanning circuit 95. Then, the reading out operation of pixel signals and an electron shuttering operation are executed. That is, the solid-state imaging device pertaining to the first embodiment of the present invention is designed such that, when the pixel array area is vertically scanned along every units of the respective pixel rows $X_{11}$ to $X_{1m}$, $X_{21}$ to $X_{2m}$, - - - , $X_{n1}$ to $X_{nm}$, unit by unit, the pixel signals on each of the pixel rows $X_{11}$ to $X_{1m}$, $X_{21}$ to $X_{2m}$, - - - , $X_{n1}$ to $X_{nm}$ are read out through the vertical signal lines assigned in each of the pixel columns $X_{11}$ to $X_{n1}$, $X_{12}$ to $X_{n2}$, - - - , $X_{1j}$ to $X_{nj}$, - - - , $X_{1m}$ to $X_{nm}$.

The methodology of signal read out from the respective pixels $X_{11}$ to $X_{1m}$, $X_{21}$ to $X_{2m}$, - - - , $X_{n1}$ to $X_{nm}$ is roughly similar to the usual CMOS image sensor. However, control signals TX1($\phi$1), TX2($\phi$2) for the charge transfers from the respective photodiodes in the respective pixels $X_{11}$ to $X_{1m}$, $X_{21}$ to $X_{2m}$, - - - , $X_{n1}$ to $X_{nm}$ are simultaneously applied to all of the pixels $X_{11}$ to $X_{1m}$, $X_{21}$ to $X_{2m}$, - - - , $X_{n1}$ to $X_{nm}$ by the timing controller 94. And, because of the signals of high frequencies, switching noises are generated in the signal read-out periods. Therefore, the signal read-out operation from the pixels is executed in the read-out period, which is scheduled after the completion of the processes executed by the noise processing circuits $NC_1$ to $NC_m$.

Figure 2:
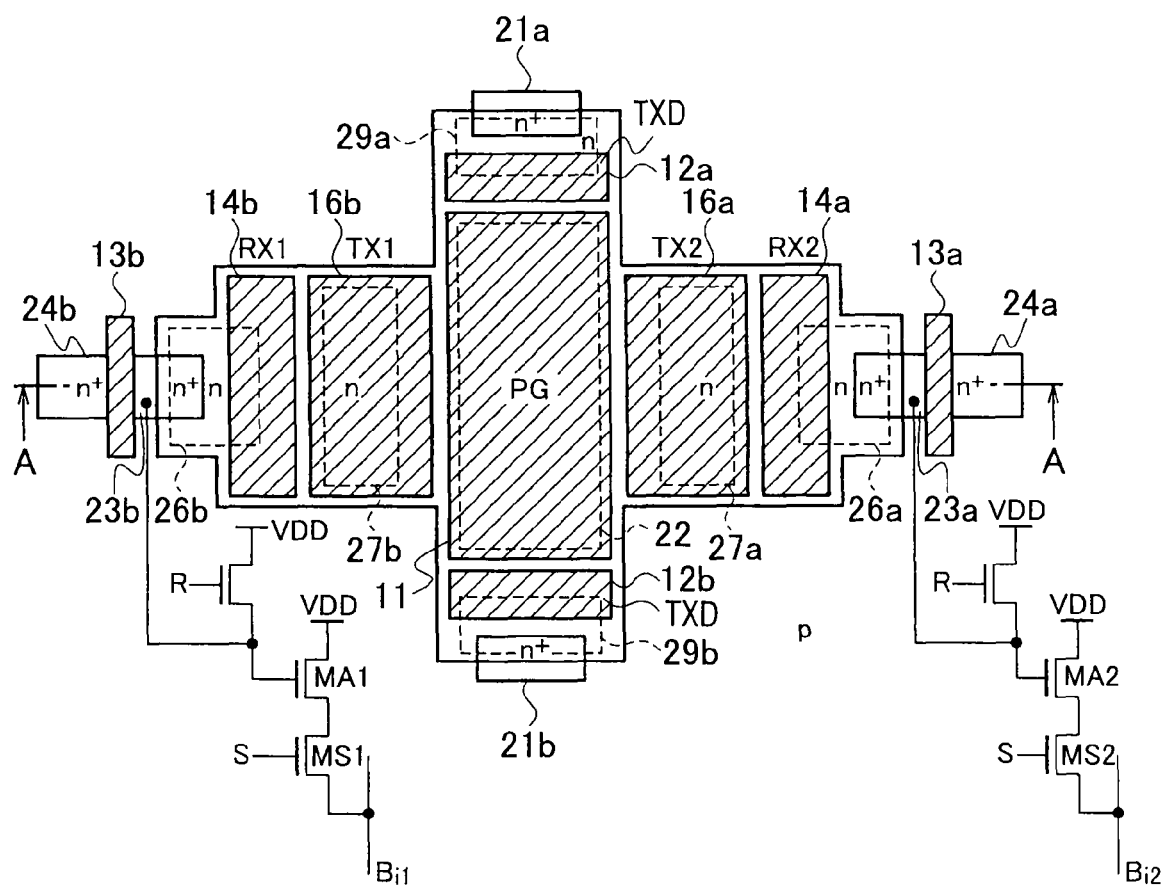
FIG. 2 is a schematic plan view describing a configuration of a semiconductor range-finding element serving as a part of a pixel in the solid-state imaging device pertaining to the first embodiment of the present invention.

FIG. 2 shows an example of the planar configuration of the semiconductor range-finding element, which serves as the TOF pixel circuit 81 disposed in each of the pixels $X_{11}$ to $X_{1m}$, $X_{21}$ to $X_{2m}$, - - - , $X_{n1}$ to $X_{nm}$ of the solid-state imaging device pertaining to the first embodiment. A semiconductor photoelectric conversion element is formed just under a light receiving gate electrode 11 shown on the center of FIG. 2, and a first transfer gate electrode 16a and a second transfer gate electrode 16b, which transfer alternately the signal charges generated by the semiconductor photoelectric conversion element toward right and left directions, are arranged on both sides of the light receiving gate electrode 11. Moreover, a first read-out gate electrode 14b is arranged on the left side of the first transfer gate electrode 16b, and a second read-out gate electrode 14a is arranged on the right side of the second transfer gate electrode 16a.

The light emitted as a repetitive pulse signal by a light source 91 in FIG. 1 is reflected by a target sample 92 and enters into the semiconductor photoelectric conversion element through the opening (not shown) of a light shielding film, which is disposed around the periphery of the light receiving gate electrode 11 in FIG. 2. That is, the semiconductor photoelectric conversion element receives the light pulse, which passes through the opening (not shown) of the light shielding film, as an optical signal and converts the optical signal into the signal charges.

Figure 3:
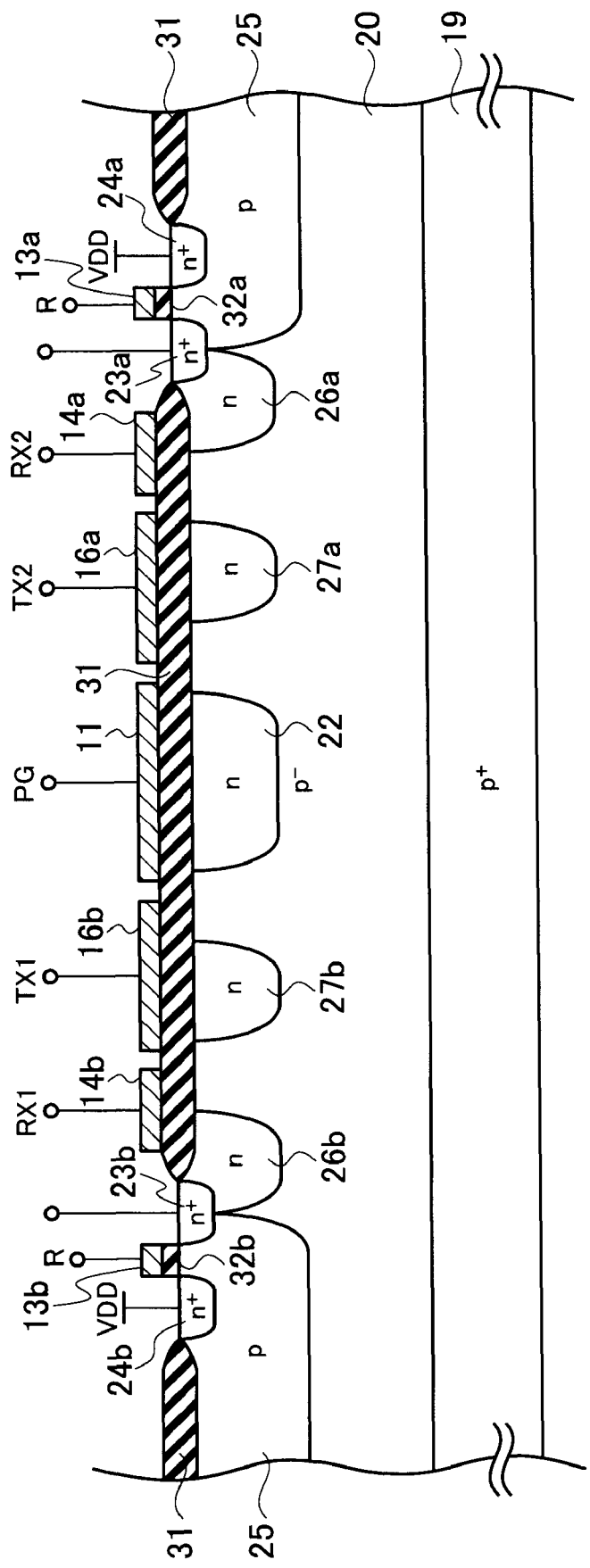
FIG. 3 is a schematic sectional view that is viewed from an A-A direction in FIG. 2.

Moreover, as shown in FIG. 2 and FIG. 3, the first floating diffusion region 23b for accumulating the signal charges, which are transferred sequentially in turn by the first transfer gate electrode 16b and the first read-out gate electrode 14b, is arranged on the left side, and the second floating diffusion region 23a for accumulating the signal charges, which are transferred sequentially in turn by the second transfer gate electrode 16a and the second read-out gate electrode 14a, is arranged on the right side.

A first reset gate electrode 13b adjacent to the first floating diffusion region 23b, and a first reset drain region 24b, which faces toward the first floating diffusion region 23b through the first reset gate electrode 13b, are further arranged on the left side of FIG. 2. On the other hand, a second reset gate electrode 13a adjacent to the second floating diffusion region 23a, and a second reset drain region 24a, which faces toward the second floating diffusion region 23a through the second reset gate electrode 13a, are further arranged on the right side of FIG. 2.

A MOS transistor serving as a first reset transistor is implemented by the first floating diffusion region 23b, the first reset gate electrode 13b and the first reset drain region 24b, and a MOS transistor serving as a second reset transistor is implemented by the second floating diffusion region 23a, the second reset gate electrode 13a and the second reset drain region 24a. For the respective first reset gate electrode 13b and second reset gate electrode 13a, control signals R are all set at a high (H) level, and the charges accumulated in the first floating diffusion region 23b and the second floating diffusion region 23a are discharged to the first reset drain region 24b and the second reset drain region 24a, respectively, and the first floating diffusion region 23b and the second floating diffusion region 23a are reset.

As shown in FIG. 2, in the semiconductor range-finding element pertaining to the first embodiment, in such a way that the signal charges generated in the semiconductor photoelectric conversion element are transferred along the directions opposite to each other (the right and left directions), in a planar pattern, the respective central lines (not shown) of the first transfer gate electrode and the second transfer gate electrode are aligned on the same straight line. Then, the respective widths of the first transfer gate electrode 16b and the second transfer gate electrode 16a, which are measured in the direction orthogonal to the transfer direction of the signal charges (the upper and lower directions in FIG. 2) are made narrower than the width of the light receiving gate electrode 11 that is measured in the orthogonal direction. Thus, even if the area of the light receiving portion just under the light receiving gate electrode 11 is made larger, the perfect transfers of the signal charges that are carried out by the first transfer gate electrode 16b and the second transfer gate electrode 16a can be executed.

FIG. 3 is the sectional structure of the semiconductor range-finding element shown in FIG. 2 and shows a semiconductor substrate 19 of the first conductivity type (p-type), a semiconductor layer (epitaxial growth layer) 20 of the first conductivity type (p-type) arranged on the semiconductor substrate 19, and the buried charge-generation region 22 of the second conductivity type (n-type) arranged on the semiconductor layer (epitaxial growth layer) 20. The semiconductor photoelectric conversion element is implemented by an insulating film 31 just under the light receiving gate electrode 11 in the central portion, the buried charge-generation region 22, the semiconductor layer (epitaxial growth layer) 20 and the semiconductor substrate 19. A local portion of the semiconductor layer (epitaxial growth layer) 20 of the first conductivity type (p-type) located just under the light receiving gate electrode 11 serves as the charge generation region of the semiconductor photoelectric conversion element. The carriers (electrons) generated in the charge generation region are injected into a part of the buried charge-generation region 22 directly over the charge generation region.

The insulating film 31 extends from just under the light receiving gate electrode 11 to under the first read-out gate electrode 14b through the first transfer gate electrode 16b on the left side, and the insulating film 31 extends from just under the light receiving gate electrode 11 to under the second read-out gate electrode 14a through the second transfer gate electrode 16a on the right side. Below the insulating film 31, the buried charge-generation region 22 is arranged just under the light receiving gate electrode 11, and a first buried charge-transfer region 27b and a second buried charge-transfer region 27a are arranged just under the first transfer gate electrode 16b and the second transfer gate electrode 16a on both sides of the buried charge-generation region 22, respectively. Moreover, a first buried charge read-out region 26b and a second buried charge read-out region 26a are arranged just under the first read-out gate electrode 14b and the second read-out gate electrode 14a on both sides of the buried charge-transfer region 27b and the second buried charge-transfer region 27a, respectively, through the insulating film 31. As can be understood from FIG. 3, the first buried charge read-out region 26b and the second buried charge read-out region 26a are formed to metallurgically contact with (join to) the first floating diffusion region 23b and the second floating diffusion region 23a, respectively. The first floating diffusion region 23b and the second floating diffusion region 23a are the semiconductor regions that are higher in impurity concentration than the buried charge-generation region 22, the first buried charge-transfer region 27b, the second buried charge-transfer region 27a, the first buried charge read-out region 26b, and the second buried charge read-out region 26a, respectively.

The portion located just under the first transfer gate electrode 16b between the buried charge-generation region 22 and the first buried charge-transfer region 27b serves as the first transfer channel, and the portion located just under the second transfer gate electrode 16a between the buried charge-generation region 22 and the second buried charge-transfer region 27a serves as the second transfer channel. That is, the first transfer gate electrode 16b and the second transfer gate electrode 16a electrostatically control the potentials in the first and second transfer channels through the insulating films 31 formed on the first and second transfer channels, respectively, as shown in FIG. 4 and FIG. 5.

For example, a negative voltage (for example, RX1=RX2=−2 V) is applied to the first read-out gate electrode 14b and the second read-out gate electrode 14a, and a negative constant voltage, for example, a constant value of PG=−2.5 V is applied to the light receiving gate electrode 11, in order to reduce the dark current. Then, for example, when TX1=0 V is applied to the first transfer gate electrode 16b and TX2=−2.5 V is applied to the second transfer gate electrode 16a, the potential distribution in the semiconductor is as shown in FIG. 4. The electrons generated by the light are transferred to the first buried charge-transfer region 27b under the first transfer gate electrode 16b. On the contrary, when TX1=−2.5 V is applied to the first transfer gate electrode 16b and TX2=0 V is applied to the second transfer gate electrode 16a, the potential distribution in the semiconductor is as shown in FIG. 5. The electrons generated by the light are transferred to the second buried charge-transfer region 27a under the second transfer gate electrode 16a. In this way, the signal charges are alternately transferred through the first and second transfer channels to the first buried charge-transfer region 27b of the second conductivity type (n-type) and the second buried charge-transfer region 27a, respectively. Then, when the first read-out gate electrode 14b and the second read-out gate electrode 14a are opened, the charges which are accumulated in the first buried charge-transfer region 27b and the second buried charge-transfer region 27a are all transferred to the first buried charge read-out region 26b and the second buried charge read-out region 26a.

That is, the first transfer gate electrode 16b and the second transfer gate electrode 16a electrostatically control the potentials in the first and second transfer channels through the insulating films 31 formed on the first and second transfer channels, respectively. Then, the signal charges are alternately transferred through the first and second transfer channels to the first buried charge-transfer region 27b of the second conductivity type (n-type) and the second buried charge-transfer region 27a, respectively.

As shown in FIG. 2, a gate electrode of a signal read-out transistor (amplification transistor) MA1 implementing the voltage-read-out buffer amplifier 82 is connected to the first floating diffusion region 23a, and a gate electrode of a signal read-out transistor (amplification transistor) MA2 of the voltage-read-out buffer amplifier 82 is connected to the second floating diffusion region 23b. A drain electrode of the signal read-out transistor (amplification transistor) MA1 is connected to a power source VDD, and a source electrode is connected to a drain electrode of a switching transistor MS1 for pixel selection. A source electrode of the switching transistor MS1 for the pixel selection is connected to a vertical signal line $B_{i1}$, and a control signal S for selecting a horizontal line is applied to the gate electrode by the vertical shift register and vertical scanning circuit 95. A drain electrode of the signal read-out transistor (amplification transistor) MA2 is connected to the power source VDD, and a source electrode is connected to a drain electrode of a switching transistor MS2 for the pixel selection. A source electrode of the switching transistor MS2 for the pixel selection is connected to a vertical signal line $B_{i2}$, and the control signal S for selecting the horizontal line is applied to the gate electrode by the vertical shift register and vertical scanning circuit 95. Since the selecting control signal S is set at the high (H) level, the switching transistors MS1, MS2 are turned on, and the currents corresponding to the potentials of the first floating diffusion region 23b and the second floating diffusion region 23a, which are amplified by the signal read-out transistors (amplification transistors) MA1, MA2, flow through the vertical signal lines $B_{i2}$, $B_{i1}$.

By the way, when the first floating diffusion region 23b and the second floating diffusion region 23a are short-circuited through any connection wiring and when the first floating diffusion region 23b and the second floating diffusion region 23a are connected to the gate electrode of a common signal read-out transistor (amplification transistor) MA, the number of the transistors in one pixel can be decreased, and since the charges are detected in the diffusion layers whose potentials are common, the characteristics of conversion gains and the like can be made equal, thereby improving the precision. For this reason, FIG. 1 shows the configuration in which the potentials of the first floating diffusion region 23b and the second floating diffusion region 23a are read out by the common signal read-out transistor (amplification transistor). As "the connection wiring" for connecting the first floating diffusion region 23b and the second floating diffusion region 23a, the surface wiring layer such as a metallic wiring, a poly-crystalline silicon wiring and the like, the buried diffusion layer, and the buried wiring layer that is buried in the semiconductor substrate 18 such as an buried refractory metal layer and the like may be used.

Also, at near side and rear side of the paper showing the cross-sectional view shown in FIG. 3, the first floating diffusion region 23b and the second floating diffusion region 23a can be merged into a continuous region through a diffusion region of the second conductivity type (n-type) so that a gate electrode of a common signal read-out transistor (amplification transistor) MA can be connected to the diffusion region. Or, in a single piece of a diffusion region of the second conductivity type (n-type), if the first floating diffusion region 23b and the second floating diffusion region 23a are merged as an integral diffusion region so that the gate electrode of a common signal read-out transistor (amplification transistor) MA can be connected to the integral diffusion region, the number of the transistors in one pixel can be decreased.

The impurity concentration of the semiconductor layer 20 serving as the charge generation region, which implements a pn junction with the buried charge-generation region 22, is lower than the impurity concentration of the semiconductor substrate 19. That is, the semiconductor substrate 19 is preferred to have the impurity concentration of about $4\times10^{17}$ cm$^{-3}$ or more and about $1\times10^{21}$ cm$^{-3}$ or less, and the semiconductor layer (epitaxial growth layer) 20 is preferred to have the impurity concentration of about $6\times10^{11}$ cm$^{-3}$ or more and about $2\times10^{15}$ cm$^{-3}$ or less.

In particular, when the semiconductor substrate 19 is assumed to be the silicon substrate having the impurity concentration of about $4\times10^{17}$ cm$^{-3}$ or more and about $1\times10^{21}$ cm$^{-3}$ or less and when the semiconductor layer (epitaxial growth layer) 20 is assumed to be the silicon epitaxial growth layer 20 having the impurity concentration of about $6\times10^{11}$ cm$^{-3}$ or more and about $2\times10^{15}$ cm$^{-3}$ or less, the usual CMOS process can be employed. As the insulating film 31, it is possible to use the insulating film (field oxide film) 31 made by a selective oxidization method, which is referred to as "local oxidation of silicon (LOCOS) method" used for the element isolation. From the viewpoint of industrial meaning, because a product with a silicon substrate 19 having the impurity concentration of about $8\times10^{17}$ cm$^{-3}$ or more and about $1\times10^{20}$ cm$^{-3}$ or less and a silicon epitaxial growth layer 20 having the impurity concentration of about $6\times10^{13}$ cm$^{-3}$ or more and about $1.5\times10^{15}$ cm$^{-3}$ or less can be easily available on the market, such impurity concentration is preferable. The thickness of the silicon epitaxial growth layer 20 may be between about 4 and 20 micrometers and preferably between about 6 and 10 micrometers. In the semiconductor layers (epitaxial growth layers) 20 located just under the light receiving gate electrode 11 and just under the first transfer gate electrode 16b and the second transfer gate electrode 16a in the left and right sides, the p-well and the n-well employed in the usual CMOS process are missing.

The peak impurity concentration and depth of the buried charge-generation region 22 are selected such that the carrier density of the hole accumulation layer at the semiconductor surface becomes sufficiently high, when a negative voltage of, for example, $-2.5$ V is applied to the light receiving gate electrode 11, considering the thickness of the insulating film (field oxide film) 31 serving as the gate insulating film. For example, in the buried charge-generation region 22, it is possible to elect the value of the impurity concentration between about $5\times10^{14}$ cm$^{-3}$ and about $5\times10^{16}$ cm$^{-3}$, preferably between about $1\times10^{15}$ cm$^{-3}$ and $2\times10^{16}$ cm$^{-3}$, typically, for example, the impurity concentration of about $1\times10^{16}$ cm$^{3}$, and its thickness can be elected to be the value between about 0.1 and 3 micrometers, preferably between about 0.5 and 1.5 micrometers.

Also, with regard to the first buried charge-transfer region 27b and the second buried charge-transfer region 27a just under the first transfer gate electrode 16b and the second transfer gate electrode 16a, the peak impurity concentration, depth and size are set such that, when the negative voltages are applied to the first transfer gate electrode 16b and the second transfer gate electrode 16a, hole accumulation layers are formed with sufficient carrier densities at semiconductor surfaces, and sufficient maximal numbers of the accumulation electrons are obtained, and such that, when the first read-out gate electrode 14b and the second read-out gate electrode 14a are opened, perfectly depleted structures are established, by transferring all of the accumulated charges in the first buried charge-transfer region 27b and the second buried charge-transfer region 27a to the first floating diffusion region 23b and the second floating diffusion region 23a.

When the manufacturing process is considered, preferably, the buried charge-generation region 22, the first buried charge-transfer region 27b, the second buried charge-transfer region 27a, the first buried charge read-out region 26b and the second buried charge read-out region 26a are set to the same impurity concentrations and depths, respectively. For example, it is possible to design the impurity concentration between about $5\times10^{14}$ cm$^{-3}$ and about $5\times10^{16}$ cm$^{-3}$, prefer- ably, the impurity concentration between about $1\times10^{15}$ cm$^{-3}$ and $2\times10^{16}$ cm$^{-3}$, and the depth between about 0.1 and 3 micrometers, preferably between about 0.5 and 1.5 micrometers.

When the insulating film 31 is made of a thermally oxidized film, the thickness of the thermally oxidized film may be between about 150 nm and about 1000 nm, and preferably between about 200 nm and about 400 nm. When the insulating film 31 is made of dielectric film other than the thermally oxidized film, an equivalent thickness in terms of the dielectric constant $\epsilon_r$ (at 1 MHz, $\epsilon_r$=3.8) of the thermally oxidized film shall be used. For example, when the CVD oxide film having a dielectric constant $\epsilon_r$=4.4 is used, the thickness may be 1.16 times (4.4/3.8) of the above-mentioned thickness of the thermally oxidized film, and when the silicon nitride ($Si_3N_4$) film having a dielectric constant $\epsilon_r$=7 is used, the thickness may be 1.84 times (7/3.8) of the above-mentioned thickness of the thermally oxidized film. However, the oxide film ($SiO_2$ film) formed by the standard CMOS technique is preferred to be used, and the use of the field oxide film in the CMOS technique is suitable for the simplification of the manufacturing step.

Figure 6:
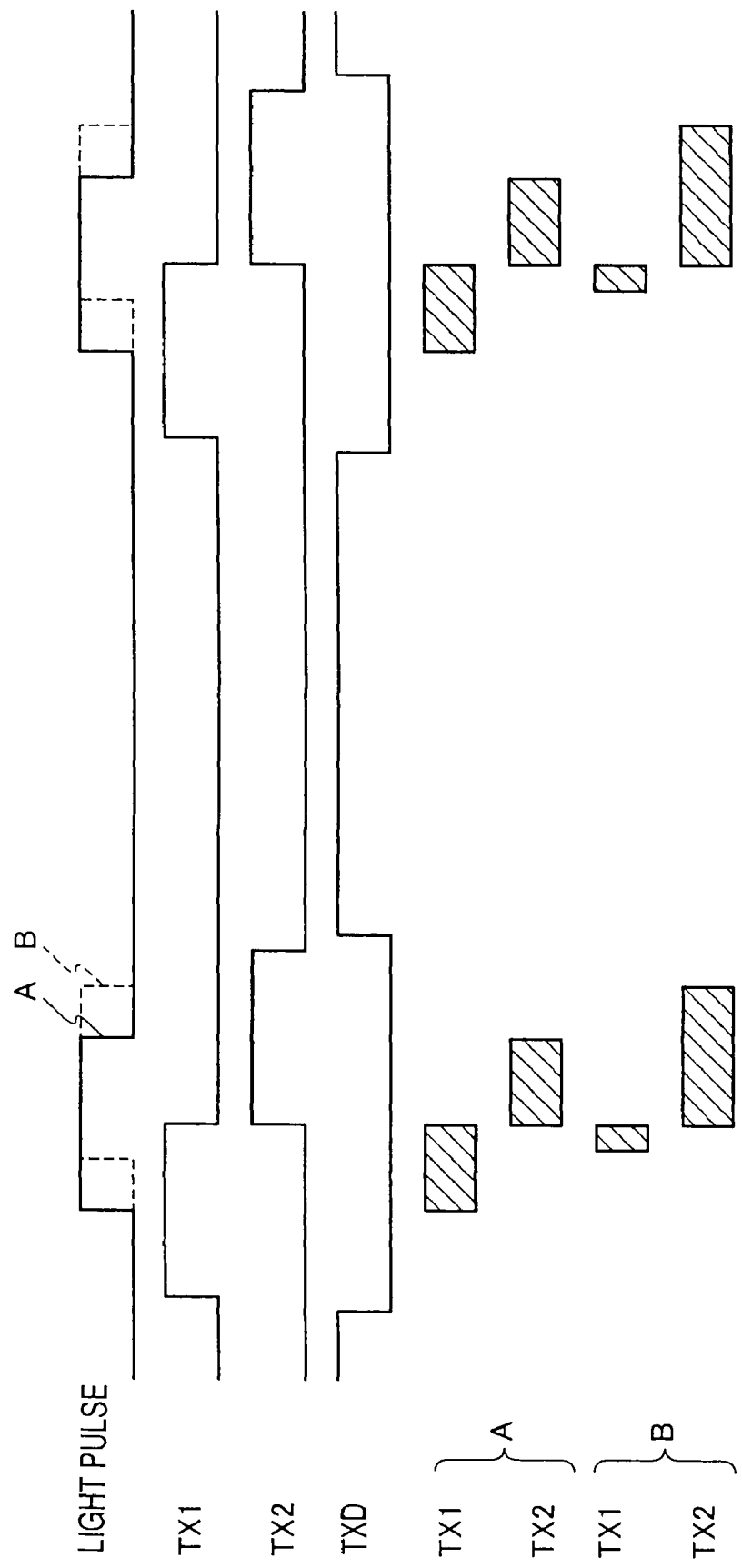
FIG. 6 is a timing chart describing a relation of an operational timing between light pulses irradiated to a light receiving gate electrode in the semiconductor range-finding element pertaining to the first embodiment and the pulse signals applied to the first transfer gate electrode and the second transfer gate electrode.

The pulse signal TX1 as shown in FIG. 6 is applied to the first transfer gate electrode 16b formed on the insulating film (field oxide film) 31, and the pulse signal TX2 in FIG. 6 is applied to the second transfer gate electrode 16a. A constant voltage PG, for example, PG=$-2.5$V is applied to the central light receiving gate electrode 11. For example, when the pulse signal TX1=0 V is applied to the first transfer gate electrode 16b and the pulse signal TX2=$-2.5$ V is applied to the second transfer gate electrode 16a, the potential distribution in the buried charge-generation region 22 is as shown in FIG. 4. Then, the electrons generated by the optical signal are transferred to the first buried charge-transfer region 27b on the left side. Conversely, when the pulse signal TX1=$-2.5$ V is applied to the first transfer gate electrode 16b and the pulse signal TX2=0 V is applied to the second transfer gate electrode 16a, the electrons generated by the optical signal are transferred to the second buried charge-transfer region 27a on the right side. The charge transfers, which are carried out on the first transfer gate electrode 16b and the second transfer gate electrode 16a, are carried out at the high speed, because the buried charge-generation region 22 is used and the carriers (electrons) run through the bulk deeper than the interface with the insulating film (field oxide film) 31 so that the influence of the interface states and surface scattering at the interface between the insulating film (field oxide film) 31 and the semiconductor is not received. That is, because the n-type buried charge-generation region 22 is buried at the upper portion of p-type silicon epitaxial growth layer 20, a vertical potential profile, which enables the carriers (electrons) to run through the deep region near the interface between the n-type buried charge-generation region 22 and the p-type silicon epitaxial growth layer 20, is formed so that the capture of the carriers (electrons), that are generated by the light, by interface states in the interface between the semiconductor region and the field oxide film 31 can be suppressed.

On the other hand, if the buried charge-generation region 22 is not provided, it takes a long time until the electrons generated in the neutral region in the deep position of p-type silicon epitaxial growth layer 20 are diffused and transferred to the vicinity of the semiconductor surface near the insulating film (field oxide film) 31, which causes a timing lag between the light pulse and the detected electrons generated by the light pulse. However, since the buried charge-generation region 22 is buried, the electrons generated in the neutral region in the deep position of p-type silicon epitaxial growth layer 20 serving as the charge generation region are injected into the buried charge-generation region 22 at a short time. Consequently, the influence caused by the timing lag between the light pulse and the detected electrons generated by the light pulse is reduced.

In the semiconductor range-finding element pertaining to the first embodiment, for example, when the light pulse as shown in FIG. 6 is emitted, the signal charges caused by the light pulse irradiated in the period of the pulse signal TX1=0 V are transferred to the first buried charge-transfer region 27 on the left side, and the signal charges caused by the light pulse irradiated in the period of the pulse signal TX2=0 V are transferred to the second buried charge-transfer region 27a on the right side. Therefore, when the light pulse has a waveform of A shown in FIG. 6, the quantities of the electrons (signal charges) respectively transferred to the first buried charge-transfer region 27b and the second buried charge-transfer region 27a are equal. On the other hand, when the light pulse such as the waveform of B indicated by the dashed line in FIG. 6 is belatedly irradiated, the signal charge quantity transferred to the second buried charge-transfer region 27a on the right side is increased. Thus, when the difference between the quantities of the electrons (signal charges) accumulated in the first buried charge-transfer region 27b on the left side and the second buried charge-transfer region 27a on the right side is determined, the delayed time of the light pulse can be estimated.

In short, an estimated distance L determined by the semiconductor range-finding element pertaining to the first embodiment is given by the distribution ratio between signal charges $Q_1$ that are transferred to and accumulated in the first buried charge-transfer region 27b on the left side and signal charges $Q_2$ that are transferred to and accumulated in the second buried charge-transfer region 27a on the right side, as indicated by the equation (1):

$$L=(cT_0/2)(Q_2/(Q_1+Q_2)) \quad (1)$$

Here, c is the light velocity, and $T_0$ is the pulse width of the light pulse.

In order to establish the equation (1), it is necessary to create the structure in which the signal charges generated by the optical signal in the semiconductor layer 20 serving as the charge generation region of the semiconductor photoelectric conversion element are transferred into the first buried charge-transfer region 27b and the second buried charge-transfer region 27a, in the very short time, as compared with the pulse width $T_0$ of the light pulse. For this reason, the semiconductor range-finding element pertaining to the first embodiment is designed to have the structure that enables the sufficiently great lateral fringing electric field to be generated in the buried charge-generation region 22 just under the first transfer gate electrode 16b and the second transfer gate electrode 16a. That is, a parallel-plate capacitor is established in the structure such that the insulating film (field oxide film) 31 implemented by the thick oxide film is disposed on the p-type silicon epitaxial growth layer 20 of a low impurity concentration, and the light receiving gate electrode 11, the first transfer gate electrode 16b and the second transfer gate electrode 16a are disposed on the insulating film (field oxide film) 31. As evident from the Gauss's law, in the parallel-plate capacitor, because the actual electric field is deviated from the approximation of the parallel-plate capacitor, in the fringing portion just under the insulating film (field oxide film) 31 corresponding to the respective edges of the first transfer gate electrode 16b and the second transfer gate electrode 16a, vertical component of the electric field generated by the potentials applied to the first transfer gate electrode 16b and the second transfer gate electrode 16a are made weak in the fringing portion so as to generate a fringing electric field, which is the electric field established in the directions other than the vertical direction. The component of the fringing electric field is liable to be increased when the insulating film (field oxide film) 31 is thick. In particular, when the thickness is set to be about 150 nm or more and about 1000 nm or less in terms of the dielectric constant of the thermally oxidized film, the fringing electric field (lateral component of the electric field) is easily generated which makes the carriers (electrons) run parallel to the surface of the substrate. However, when the insulating film (field oxide film) 31 is made thick, the fringing electric fields (that is, the lateral components of the electric fields at the edges of the electrodes) are easily generated. However, when the insulating film (field oxide film) 31 is made excessively thick, because the electric field itself becomes weak so that the lateral components of the electric fields at the edges of the electrodes becomes weak, the thickness of about 1000 nm or more in terms of the dielectric constant of the thermally oxidized film is not preferable. Hence, the thickness of about 200 nm or more and about 400 nm or less in terms of the dielectric constant of the thermally oxidized film is preferable because a large fringing electric field can be established.

Actually, with a voltage V1, which is read out as a voltage proportional to the signal charges, corresponding to the accumulated charges in the first buried charge-transfer region 27a and a voltage V2, which is read out as a voltage proportional to the signal charges, corresponding to the accumulated charges in the second buried charge-transfer region 27a, the estimated distance L is determined by the equation (2):

$$L=(cT_0/2)(V_2/(V_1+V_2)) \quad (2)$$

In the first embodiment of the present invention, in addition to the structure for transferring such signal charges $Q_1$, $Q_2$, a first exhaustion gate electrode 12a and a second exhaustion gate electrode 12b are provided on upper and lower locations in the plan view in FIG. 2, in order to remove the influence of the background light. That is, the background-light charges are exhausted through the first exhaustion gate electrode 12a and the second exhaustion gate electrode 12b to a first exhaustion drain region 21a and a second exhaustion drain region 21b, which serve as exhausting outlets. As indicated on the timing chart shown in FIG. 7, while control pulse signals TXD are given to the first exhaustion gate electrode 12a and second exhaustion gate electrode 12b that are located on the upper and lower portions, the time interval of the control pulse signal TXD is set to be longer than the time intervals of the control pulse signals TX1, TX2 which are applied to the first transfer gate electrode 16b and the second transfer gate electrode 16a. That is, in the period in which the optical pulse is not sent out, the potential of the control pulse signal TXD is set high, and the background-light charges generated in the background light are exhausted to the first exhaustion drain region 21a and the second exhaustion drain region 21b.

When the control pulse signal TX1 is given to the first transfer gate electrode 16b, the control pulse signal TX is given to the second transfer gate electrode 16a, so that the signal charges are distributed toward the left and right directions, negative voltages (for example, TXD=−2V) are applied to the first exhaustion gate electrode 12a and the second exhaustion gate electrode 12b so that potential barriers are formed, by which the charges are not transferred to the first exhaustion drain region 21a and the second exhaustion drain region 21b.

On the other hand, when the background-light charges are scheduled to be exhausted, high potentials (for example, 1 V) are applied to the first exhaustion gate electrode 12a and the second exhaustion gate electrode 12b so that the transferring of the background-light charges to the first exhaustion drain region 21a and the second exhaustion drain region 21b can be facilitated.

By the way, the voltages TXD applied to the first exhaustion gate electrode 12a and the second exhaustion gate electrode 12b are not especially required to be equal, and even if the mutually complementary positive/negative voltages are applied, the exhaustions can be established. Also, even if the same positive voltages are applied, the background-light charges can be exhausted. That is, the various voltages having the flexibilities can be assigned as the voltages TXD that are applied to the first exhaustion gate electrode 12a and the second exhaustion gate electrode 12b. Thus, by applying the various voltages, it is possible to effectively remove the influence of the background-light charges.

As shown in FIG. 2 and FIG. 3, a gap between the light receiving gate electrode 11 and the first transfer gate electrode 16b and a gap between the light receiving gate electrode 11 and the second transfer gate electrode 16a are preferred to be one micrometer or less. With regard to CCD and the like, a technique is known, which uses double-level polysilicon so as to decrease the width of the gaps between the transfer gate electrodes adjacent to each other, consequently suppressing the formation of the potential barriers in the gaps. However, also in the semiconductor range-finding element pertaining to the first embodiment, the gap between the light receiving gate electrode 11 and the first transfer gate electrode 16b and the gap between the light receiving gate electrode 11 and the second transfer gate electrode 16a are desired to be narrowed to the minimal gap dimension that is allowed by the current superfine processing technique. By using a double exposure technique or an opening contraction technique that uses a tetra ethyl ortho-silicate (TEOS) film deposited by CVD or the like, it is possible to attain the gap of 60 nm or less or 50 nm or less, even in optical exposure. In the semiconductor range-finding element pertaining to the first embodiment, the thick insulating film (field oxide film) 31 that has the thickness of about 150 nm or more and about 1000 nm or less in terms of the dielectric constant of the thermally oxidized film is used, and the gap between the light receiving gate electrode 11 and the first transfer gate electrode 16b and the gap between the light receiving gate electrode 11 and the second transfer gate electrode 16a are made hyperfine by using the sufficient micro-fabrication technique. Consequently, even in the single-level electrode structure (for example, the single-level polysilicon electrode structure) as shown in FIG. 3, the potential fluctuation is generated in the buried charge-generation regions 22 just under the gap between the light receiving gate electrode 11 and the first transfer gate electrode 16b and just under the gap between the light receiving gate electrode 11 and the second transfer gate electrode 16a, and it is possible to suppress the formation of the potential barrier.

<Operation of Solid-State Imaging Device>

The operations of the solid-state imaging device (two-dimensional image sensor) pertaining to the first embodiment of the present invention whose schematic configuration is shown in FIG. 1 will be described below by using FIG. 7. As shown in FIG. 2, the solid-state imaging device pertaining to the first embodiment has the pixel structure in which the first transfer gate electrode 16b and the second transfer gate electrode 16a are provided on the left and right sides of the light receiving gate electrode 11 so that the charges generated by the optical pulses are delivered to the left and right sides. However, in the following description, the case in which the first floating diffusion region 23b and the second floating diffusion region 23a are common and the reading-out operation is carried out sequentially by using a single read-out amplifier is described (however, as shown in FIG. 2, the scheme of two read-out amplifier systems, each of the systems assigned to the first floating diffusion region 23b and the second floating diffusion region 23a, by which the reading-out operations are executed in parallel, is advantageous from the viewpoint of the read-out speed. Although the read-out timing differs from FIG. 7 and the configuration of the noise canceling circuit differs from FIG. 1, only a change such that the two signals can be sampled simultaneously is required to perform the scheme of the two read-out amplifier systems.).

Figure 7:
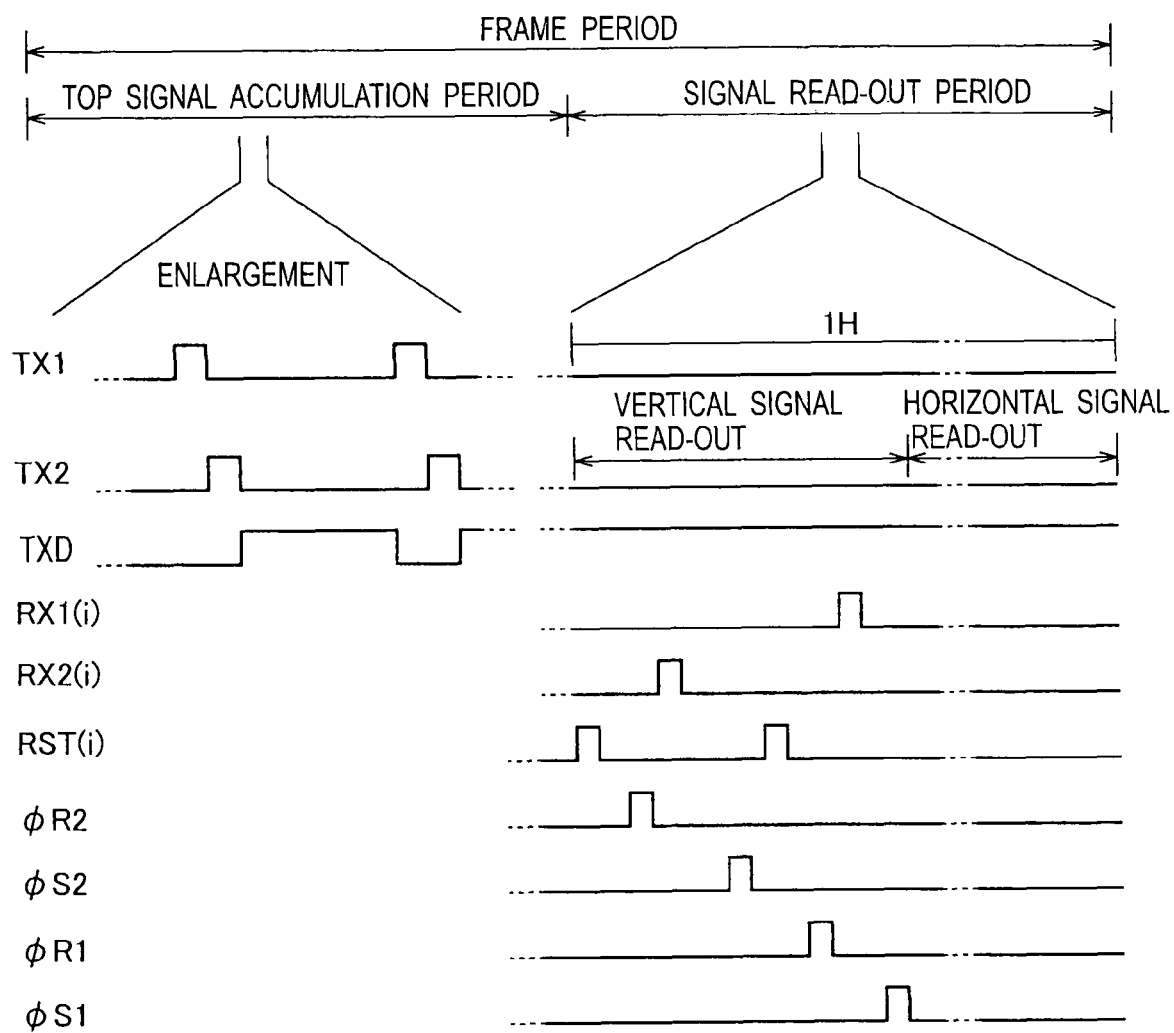
FIG. 7 is a timing chart describing the operations of the solid-state imaging device pertaining to the first embodiment shown in FIG. 1.

(a) At first, in the TOF signal accumulation period shown on the left side of FIG. 7, with regard to the pixels $X_{11}$ to $X_{1m}$, $X_{21}$ to $X_{2m}$, - - -, $X_{n1}$ to $X_{nm}$ shown in FIG. 1, the negative voltages (for example, RX1=RX2=2 V) are applied to the respective first read-out gate electrode 14a and second read-out gate electrode 14b. In the period in which the optical pulse is not sent out, the potential of the control pulse signal TXD is set high, and the background-light charges generated in the background light are exhausted to the first exhaustion drain region 21a and the second exhaustion drain region 21b. That is, the control pulse signals TXD are given to the first exhaustion gate electrode 12a and the second exhaustion gate electrode 12b in FIG. 2. However, as shown in the timing chart in FIG. 7, the time interval of the control pulse signal TXD applied to the first exhaustion gate electrode 12a and the second exhaustion gate electrode 12b is set to be longer than the time intervals of the control pulse signals TX1, TX2 applied to the first transfer gate electrode 16b and the second transfer gate electrode 16a.

(b) After that, the control pulse signal TXD=0 V is applied. Then, the light pulse is sent out from the light source 91, and the light pulse reflected by the target sample 92 enters through the opening (not shown) of the light shielding film 41 in each of the pixels $X_{11}$ to $X_{1m}$, $X_{21}$ to $X_{2m}$, - - -, $X_{n1}$ to $X_{nm}$ into each of the semiconductor photoelectric conversion elements. In synchronization with the light pulse, the repetitive pulses TX1, TX2 are given to all of the first transfer gate electrodes 16b and all of the second transfer gate electrodes 16a in each of all the pixels $X_{11}$ to $X_{1m}$, $X_{21}$ to $X_{2m}$, - - -, $X_{n1}$ to $X_{nm}$ at the timing as shown in FIG. 7, at once in a constant time period. That is, as shown in FIG. 7, in order to detect the charges based on the delay time of the optical pulse, as for TX1 and TX2, since the pulses of the negative voltages (for example, the pulses of 0, −2.5 V) are alternately applied in synchronization with the optical pulse, the signal charges are accumulated in the first buried charge-transfer region 27b and the second buried charge-transfer region 27a. In the TOF signal accumulation period, the constant voltage PG, for example, PG=−2.5 V is applied to the central light receiving gate electrode 11, in order to reduce the dark current. After that, the emission of the light pulse from the light source 91 is stopped, and the operational flow proceeds to a signal read-out period. In the signal read-out period, the potential of the control pulse signal TXD is again set high, and the background-light charges generated in the background light are exhausted to the first exhaustion drain region 21a and the second exhaustion drain region 21b.

(c) In the signal read-out period shown on the right side in FIG. 7, the signal read-out operation is performed on the pixel signals corresponding to one row of pixels selected by the output of the vertical shift register, in synchronization with the charge transfer in each of the pixels. That is, for each horizontal line, the pixel signals are read out to the noise processing circuits $NC_1$ to $NC_m$ of the corresponding columns, and in each of the noise processing circuits $NC_1$ to $NC_m$, noise canceling operations are carried out by a first noise canceling circuit 84 and a second noise canceling circuit 83, and a horizontal scanning is then executed. At first, a pulse of a control signal RST (i) is given, and a reset level when the second floating diffusion region 23a is reset is sampled and stored in the second noise canceling circuit 83 of the column through a φR2 pulse. Next, an RX2 pulse is given, and the charges are transferred from the second buried charge-transfer region 27a through the second buried charge read-out region 26a to the second floating diffusion region 23a. The signal level when the RX2 pulse is given is sampled and stored in the second noise canceling circuit 83 of the column through the φR2 pulse. Moreover, the pulse of the control signal RST (i) is again given, and the first floating diffusion region 23b is reset, and the reset level is sampled and stored in the first noise canceling circuit 84 of the column through the φR1 pulse. Next, an RX1 pulse is given, and the charges are transferred from the first buried charge-transfer region 27b through the first buried charge read-out region 26b to the first floating diffusion region 23b. The signal level when the RX1 pulse is given is sampled and stored in the first noise canceling circuit 84 of the column through a φS1 pulse. By the first noise canceling circuit 84 and the second noise canceling circuit 83 in each of the noise processing circuits $NC_1$ to $NC_m$, the reset level is subtracted from the signal level, and the two signals (voltages corresponding to the accumulated charges) V1, V2 are extracted. Then, the extracted two signals V1, V2 are sequentially read out to the outside through the horizontal scanning. The selection of one horizontal scanning is carried out by giving the control signal S to each of the switching transistors MS1, MS2 for pixel selection, which are assigned in each of the voltage-read-out buffer amplifiers 82 in each of the pixels $X_{11}$ to $X_{1m}, X_{21}$ to $X_{2m}, ---, X_{n1}$ to $X_{nm}$. Then, the signal of the horizontal line corresponding to the vertical signal is generated.

As mentioned above, according to the semiconductor range-finding element pertaining to the first embodiment, the buried charge-generation region 22, the first buried charge-transfer region 27b, the second buried charge-transfer region 27a, the first buried charge read-out region 26b and the second buried charge read-out region 26a are buried as the island-shaped n-type surface buried region 22. Thus, the transfer channel, through which the electrons (the signal charges) are transferred, is not allocated in the interface between the semiconductor region and the insulating film 31, but is buried in the deep position, which is close to the interface between the p-type silicon epitaxial growth layer 20 and the n-type buried charge-generation region 22. Thus, the electrons (the signal charges) are never captured by interface states. If the electrons (the signal charges) are captured by interface states, they are discharged after the elapse of a time, and the response is delayed, which reduces the distance resolution. In particular, since the negative bias is applied to the light receiving gate electrode 11, the dark current generated at interface states between the semiconductor region and the insulating film 31 is reduced. Also, it is possible to protect the electrons generated by the optical pulse from being trapped by the interface states and prevent the response from being delayed.

Also, in order that the dark current is not accumulated to the signal electrons accumulated in the first buried charge-transfer region 27b and the second buried charge-transfer region 27a, the first transfer gate electrode 16b and the second transfer gate electrode 16a are operated by the negative pulse.

Thus, the holes are periodically accumulated on the surfaces of the first buried charge-transfer region 27b and the second buried charge-transfer region 27a under the first transfer gate electrode 16a and the second transfer gate electrode 16b. Hence, the dark current can be reduced.

Moreover, the read-out operation of the semiconductor range-finding element pertaining to the first embodiment is carried out, using the first read-out gate electrode 14b and the second read-out gate electrode 14a, by transferring the charges to the first floating diffusion region 23b and the second floating diffusion region 23a. Thus, it is possible to ignore the dark currents generated in the first floating diffusion region 23b and the second floating diffusion region 23a. Moreover, the correlated double sampling circuit provided in the column can be used to cancel the reset noise that are generated in the first floating diffusion region 23b and the second floating diffusion region 23a. Hence, the lower noise performance is achieved, and the distance resolution in lower illumination regime is improved.

By the way, the first floating diffusion region 23b and the second floating diffusion region 23a and the read-out transistor can be made common. Such common design scheme can decrease the number of the transistors inside one pixel. Also, since the charge detection is carried out in the same diffusion layer, the characteristics such as the conversion gain and the like can be made equal, thereby improving the precision.

Moreover, in each of the pixels, predetermined voltages are applied to the first exhaustion gate electrode 12a and the second exhaustion gate electrode 12b, and the background-light charges are transferred to the first exhaustion drain region 21a and the second exhaustion drain region 21b, and the influence of the background light can be suppressed. Thus, the shot noise caused by the background-light charges can be suppressed, thereby achieving a high distance measurement precision (distance resolution) and the maximal distance measurement range. In particular, in each of the pixels, because it is possible to protect the background-light charges from being accumulated in the first buried charge-transfer region 27b and the second buried charge-transfer region 27a, thereby using full capacities of the first buried charge-transfer region 27b and the second buried charge-transfer region 27a for accumulating the signal charges, a wide dynamic range can be achieved. Moreover, when the dynamic range is represented by the maximal value of the signals and the noise level, as the noise caused by the background-light charges decreases, the dynamic range increases.

Moreover, when the semiconductor range-finding elements pertaining to the first embodiment are arrayed in the shape of the two-dimensional matrix shown in FIG. 1, because the semiconductor range-finding element can be manufactured with a lower fabrication cost and a simple structure to achieve a higher distance resolution, it is possible to manufacture a TOF type range-finding image sensor, in which a large number of pixels are arranged so as to achieve a high space resolution. The earlier-developed TOF type range-finding image sensor has about 20,000 pixels or less. However, in the solid-state imaging device (the TOF type range-finding image sensor) pertaining to the first embodiment, 320×240 pixels, namely, about 77,000 pixels can be easily manufactured, which can greatly improve the resolution, as compared with the earlier technique.

Second Embodiment

The entire configuration of the solid-state imaging device (two-dimensional image sensor) according to a second embodiment of the present invention is equal to the block diagram shown in FIG. 1. Thus, the duplex explanations are omitted. Also, the planar configuration of a semiconductor range-finding element serving as a TOF pixel circuit 81 assigned in each of the pixels $X_{11}$ to $X_{1m}$, $X_{21}$ to $X_{2m}$, - - - , $X_{n1}$ to $X_{nm}$ in the solid-state imaging device pertaining to the second embodiment is basically similar to the planar configuration shown in FIG. 2, which has been shown as one example of the planar configuration of the semiconductor range-finding element pertaining to the first embodiment, with regard to the pattern of the surface wirings delineated on the insulating film 31. Hence, the duplex explanations are omitted.

Figure 8:
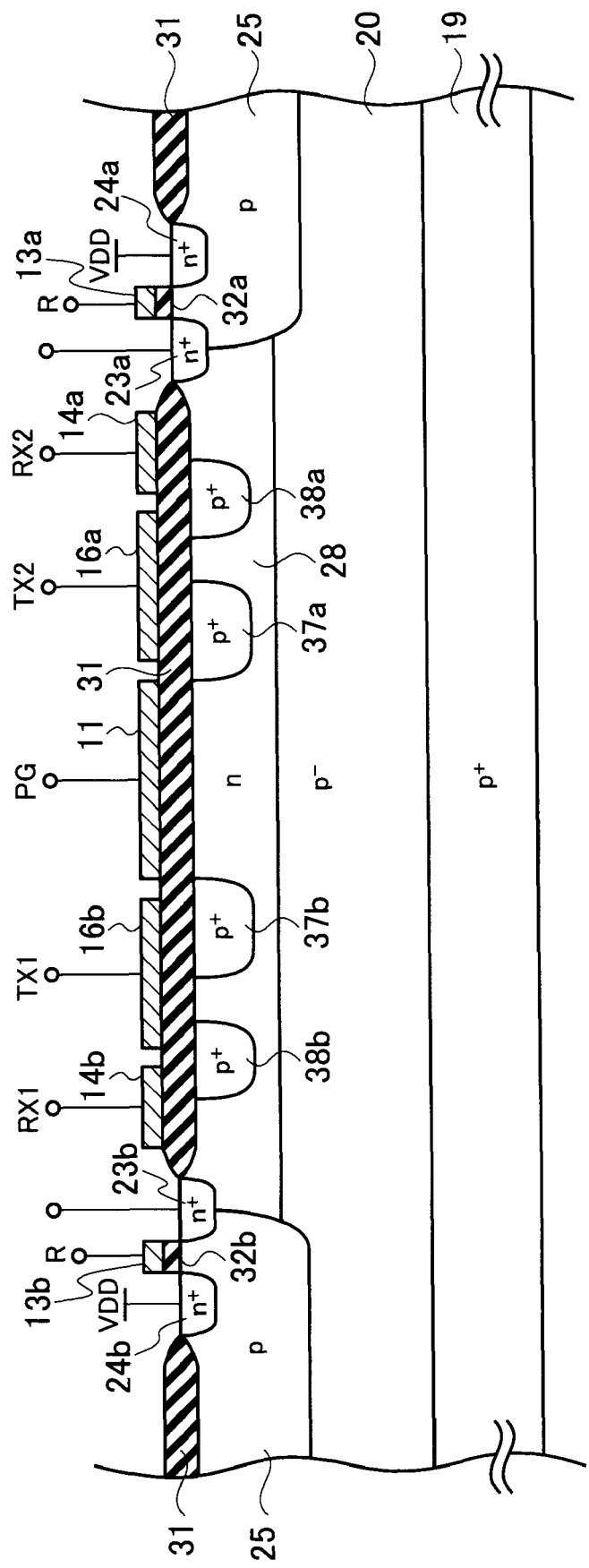
FIG. 8 is a schematic sectional view describing a configuration of a semiconductor range-finding element serving as a part of a pixel of a solid-state imaging device according to a second embodiment of the present invention when it is viewed from a direction corresponding to an A-A direction in FIG. 2.

FIG. 8 is the sectional structure of the semiconductor range-finding element shown in FIG. 2. Although, the configuration such that the semiconductor range-finding element encompasses a semiconductor substrate 19 of first conductivity type (p-type), and a semiconductor layer (epitaxial growth layer) 20 of the first conductivity type (p-type) arranged on the semiconductor substrate 19 is similar to the semiconductor range-finding element pertaining to the first embodiment, a surface buried region 28 of a second conductivity type (n-type) disposed on the semiconductor layer 20, as a wide region surrounded with p-wells 25, differs from the configuration of the semiconductor range-finding element pertaining to the first embodiment.

As shown in FIG. 8, similarly to the semiconductor range-finding element pertaining to the first embodiment, the insulating film 31 extends from just under the light receiving gate electrode 11 leftward through under the first transfer gate electrode 16b to under the first read-out gate electrode 14b and extends rightward through under the second transfer gate electrode 16a to under the second read-out gate electrode 14a. A localized portion of the surface buried region 28 just under the light receiving gate electrode 11 through the insulating film 31 implements a part of the semiconductor photoelectric conversion element and corresponds to the buried charge-generation region 22 in the semiconductor range-finding element pertaining to the first embodiment. That is, the insulating film 31 just under the central light receiving gate electrode 11, the surface buried region 28, the semiconductor layer (epitaxial growth layer) 20 and the semiconductor substrate 19 implement the semiconductor photoelectric conversion element. A part of the semiconductor layer (epitaxial growth layer) 20 of the first conductivity type (p-type) located just under the light receiving gate electrode 11 serves as the charge generation region of the semiconductor photoelectric conversion element. The carriers (electrons) generated in the charge generation region are injected into a part of the surface buried region 28 just over the charge generation region.

Then, a first transfer-barrier region 37b of the first conductivity type (p-type) and a second transfer-barrier region 37a are arranged just under the first transfer gate electrode 16b and the second transfer gate electrode 16a on both sides of the central surface buried region 28, respectively. Moreover, such configuration that a first charge-read-out barrier region 38b of the first conductivity type (p-type) and a second charge-read-out barrier region 38a are arranged just under the first read-out gate electrode 14b and the second read-out gate electrode 14a on both sides of the first transfer-barrier region 37b and the second transfer-barrier region 37a, respectively, differs from the semiconductor range-finding element pertaining to the first embodiment.

However, in the potential diagram of the structure shown in FIG. 8, basically equivalent potential wells are established by potential barriers, which are implemented by the first transfer-barrier region 37b and the second transfer-barrier region 37a, to the potential diagram of the structure shown in FIG. 3, which has been explained in the first embodiment. Then, the first transfer gate electrode 16b and the second transfer gate electrode 16a electrostatically control the potentials in the first transfer-barrier region 37b and the second transfer-barrier region 37a through the insulating films 31 formed on the respective first and second transfer channels, similarly to FIG. 4 and FIG. 5. That is, the first transfer-barrier region 37b and the second transfer-barrier region 37a serve as the potential barrier control regions equivalent to the first transfer channel and the second transfer channel of the semiconductor range-finding element pertaining to the first embodiment, respectively.

In FIG. 8, a portion of the surface buried region 28 disposed between the first transfer-barrier region 37b and the first read-out gate electrode 14b corresponds to the first buried charge-transfer region 27b of the semiconductor range-finding element pertaining to the first embodiment, and a portion of the surface buried region 28 disposed between the second transfer-barrier region 37a and the second read-out gate electrode 14a corresponds to the second buried charge-transfer region 27a in the semiconductor range-finding element pertaining to the first embodiment.

Moreover, a portion of the surface buried region 28 disposed on the left side of the first charge-read-out barrier region 38b in FIG. 8 corresponds to the first buried charge read-out region 26b in the semiconductor range-finding element pertaining to the first embodiment. Moreover, a portion of the surface buried region 28 disposed on the right side of the second charge-read-out barrier region 38a corresponds to the second buried charge read-out region 26a in the semiconductor range-finding element pertaining to the first embodiment. For this reason, as shown in FIG. 8, the surface buried region 28 on the left side of the first charge-read-out barrier region 38b is formed so as to metallurgically contact with (join to) the first floating diffusion region 23b, and the surface buried region 28 on the right side of the second charge-read-out barrier region 38a is formed so as to metallurgically contact with (join to) the second floating diffusion region 23a. The first floating diffusion region 23b and the second floating diffusion region 23a are the semiconductor regions that are higher in impurity concentration than the surface buried region 28, respectively.

Because the potential profile in the diagram shown in FIG. 8 can establish the basically equivalent potential wells as the potential profile explained in the diagram shown in FIG. 3 in the first embodiment, even in the structure shown in FIG. 8, similarly to the semiconductor range-finding element pertaining to the first embodiment, the similar operation is carried out such that the signal charges are accumulated in the first floating diffusion region 23b, after the signal charges are transferred through the potential wells sequentially by the first transfer gate electrode 16b and the first read-out gate electrode 14b, and such that the signal charges are accumulated in the second floating diffusion region 23a, after the signal charges are transferred through the potential wells sequentially by the second transfer gate electrode 16a and the second read-out gate electrode 14a.

The configuration in which the first reset gate electrode 13b and the first reset drain region 24b that faces to the first floating diffusion region 23b through the first reset gate electrode 13 are further arranged adjacent to the first floating diffusion region 23b on the left side in FIG. 8 and in which the second reset gate electrode 13a and the second reset drain region 24a that faces to the second floating diffusion region 23a through the second reset gate electrode 13a are further arranged adjacent to the second floating diffusion region 23a on the right side in FIG. 8 is similar to the semiconductor range-finding element pertaining to the first embodiment.

That is, a MOS transistor serving as a first reset transistor is implemented by the first floating diffusion region 23b, the first reset gate electrode 13b and the first reset drain region 24b, and a MOS transistor serving as a second reset transistor is implemented by the second floating diffusion region 23a, the second reset gate electrode 13a and the second reset drain region 24a. For each of the first reset gate electrode 13b and the second reset gate electrode 13a, both of the control signals R are set to a high (H) level, and the charges accumulated in the first floating diffusion region 23b and the second floating diffusion region 23a are discharged to the first reset drain region 24b and the second reset drain region 24a, respectively, and the first floating diffusion region 23b and the second floating diffusion region 23a are reset.

As described in the beginning of the description in the second embodiment, the pattern of the surface wirings on the insulating film 31 is basically similar to the pattern shown in FIG. 2, which is shown as one example of the planar structure of the semiconductor range-finding element pertaining to the first embodiment. Thus, although the plan view is omitted, even in the semiconductor range-finding element pertaining to the second embodiment, in such a way that the signal charges generated by the semiconductor photoelectric conversion element are transferred in the opposite directions (left and right directions) to each other, the respective central lines of the first transfer gate electrode and the second transfer gate electrode are arranged on the same straight line, on the planar pattern. Then, the respective widths of the first transfer gate electrode 16b and the second transfer gate electrode 16a that are measured in the direction orthogonal to the transferring direction of the signal charges are made narrower than the width of the light receiving gate electrode 11 measured in the orthogonal direction. Thus, even if the area of the light receiving section just under the light receiving gate electrode 11 is made large, the perfect transferring of the signal charges that are carried out by the first transfer gate electrode 16b and the second transfer gate electrode 16a are designed to be attained.

Although the plan view is omitted, even in the second embodiment of the present invention, similarly to the plan view in the first embodiment shown in FIG. 2, in order to remove the influence of the background light, the first exhaustion gate electrode 12a and the second exhaustion gate electrode 12b are provided, and the background-light charges are exhausted through the first exhaustion gate electrode 12a and the second exhaustion gate electrode 12b to the first exhaustion drain region 21a and the second exhaustion drain region 21b that serve as the exhausting outlets.

Similarly to the illustration in FIG. 2 in the first embodiment, the gate electrode of the signal read-out transistor (amplification transistor) MA1 implementing the voltage-read-out buffer amplifier 82 is connected to the first floating diffusion region 23b, and the gate electrode of the signal read-out transistor (amplification transistor) MA2 of the voltage-read-out buffer amplifier 82 is connected to the second floating diffusion region 23a. The drain electrode of the signal read-out transistor (amplification transistor) MA1 is connected to the power source VDD, and the source electrode is connected to the drain electrode of the switching transistor MS1 for the pixel selection. The source electrode of the switching transistor MS1 for the pixel selection is connected to the vertical signal line $B_{i1}$, and the control signal S for selecting the horizontal line is applied to the gate electrode by the vertical shift register and vertical scanning circuit 95. The drain electrode of the signal read-out transistor (amplification transistor) MA2 is connected to the power source VDD, and the source electrode is connected to the drain electrode of the switching transistor MS2 for the pixel selection. The source electrode of the switching transistor MS2 for the pixel selection is connected to the vertical signal line $B_{i2}$, and the control signal S for selecting the horizontal line is applied to the gate electrode by the vertical shift register and vertical scanning circuit 95. Since the selecting control signal S is set at the high level, the switching transistors MS1, MS2 are turned on, and the currents, which correspond to the potentials of the first floating diffusion region 23b and the second floating diffusion region 23a, are amplified by the signal read-out transistors (amplification transistors) MA1, MA2 and flow through the vertical signal lines $B_{i2}$, $B_{i1}$.

The peak impurity concentration and depth of the surface buried region 28 are determined such that the carrier density of the hole accumulation layer on the semiconductor surface becomes sufficiently high, when the negative voltage of, for example, −2.5 V is applied to the light receiving gate electrode 11, considering the thickness of the insulating film (field oxide film) 31 serving as the gate insulating film. For example, in the surface buried region 28, it is possible to employ the value of the impurity concentration between about $5\times10^{14}$ cm$^{-3}$ and about $5\times10^{16}$ cm$^{-3}$, preferably between about $1\times10^{15}$ cm$^{-3}$ and $2\times10^{16}$ cm$^{-3}$, typically, for example, the impurity concentration of about $1\times10^{16}$ cm$^{-3}$, and its thickness can be between about 0.1 and 3 micrometers, preferably between about 0.5 and 1.5 micrometers.

Also, with regard to the surface buried region 28 just under the first transfer gate electrode 16b and the second transfer gate electrode 16a, the peak impurity concentration, depth and size are set such that, when the negative voltages are applied to the first transfer gate electrode 16b and the second transfer gate electrode 16a, the hole accumulation layer is formed with sufficiently high carrier density on the semiconductor surface, and the sufficient maximal number of the accumulation electrons are obtained, and when the first read-out gate electrode 14b and the second read-out gate electrode 14a are opened, such that all of the charges accumulated in the potential well in the surface buried region 28 can be transferred to the first floating diffusion region 23b and the second floating diffusion region 23a, establishing a perfectly depleted structure.

In view of the manufacturing process, the first transfer-barrier region 37b, the second transfer-barrier region 37a, the first charge-read-out barrier region 38b and the second charge-read-out barrier region 38a of the first conductivity type (p-type) are set to the same impurity concentrations and depths, such that the same impurity concentration is between about $6\times10^{16}$ cm$^{-3}$ and about $5\times10^{19}$ cm$^{-3}$, preferably, the same impurity concentration is between about $1\times10^{17}$ cm$^{-3}$ and $2\times10^{18}$ cm$^{-3}$, and the same depth is between about 0.05 and 2 micrometers, preferably between about 0.8 and 1.2 micrometers.

In the solid-state imaging device (two-dimensional image sensor) pertaining to the second embodiment of the present invention, as the potential diagram established by the structure shown in FIG. 8 is understood to be basically equivalent to the potential diagram established by the structure shown in FIG. 3, which has been explained in the first embodiment, the operation of the solid-state imaging device pertaining to the second embodiment may be easily understood to be basically equal to the operation of the solid-state imaging device pertaining to the first embodiment described by using FIG. 7. Thus, the duplex operation explanations are omitted.

In the structure of the solid-state imaging device pertaining to the first embodiment shown in FIG. 2 and FIG. 3, the transfer-direction establishing region that is implemented by the buried charge-generation region 22 of n-type, the first buried charge-transfer region 27b, the second buried charge-transfer region 27a, the first buried charge read-out region 26b and the second buried charge read-out region 26a, and the light receiving gate electrode 11, the first transfer gate electrode 16b, the second transfer gate electrode 16a, the first read-out gate electrode 14b and the second read-out gate electrode 14a are not delineated by the self-alignment technology. For this reason, when the misalignment delta occurs in the lithography step to delineate respective regions of the buried charge-generation region 22, the first buried charge-transfer region 27b, the second buried charge-transfer region 27a, the first buried charge read-out region 26b and the second buried charge read-out region 26a, a problem shown in FIG. 9 is generated.

Figure 9:
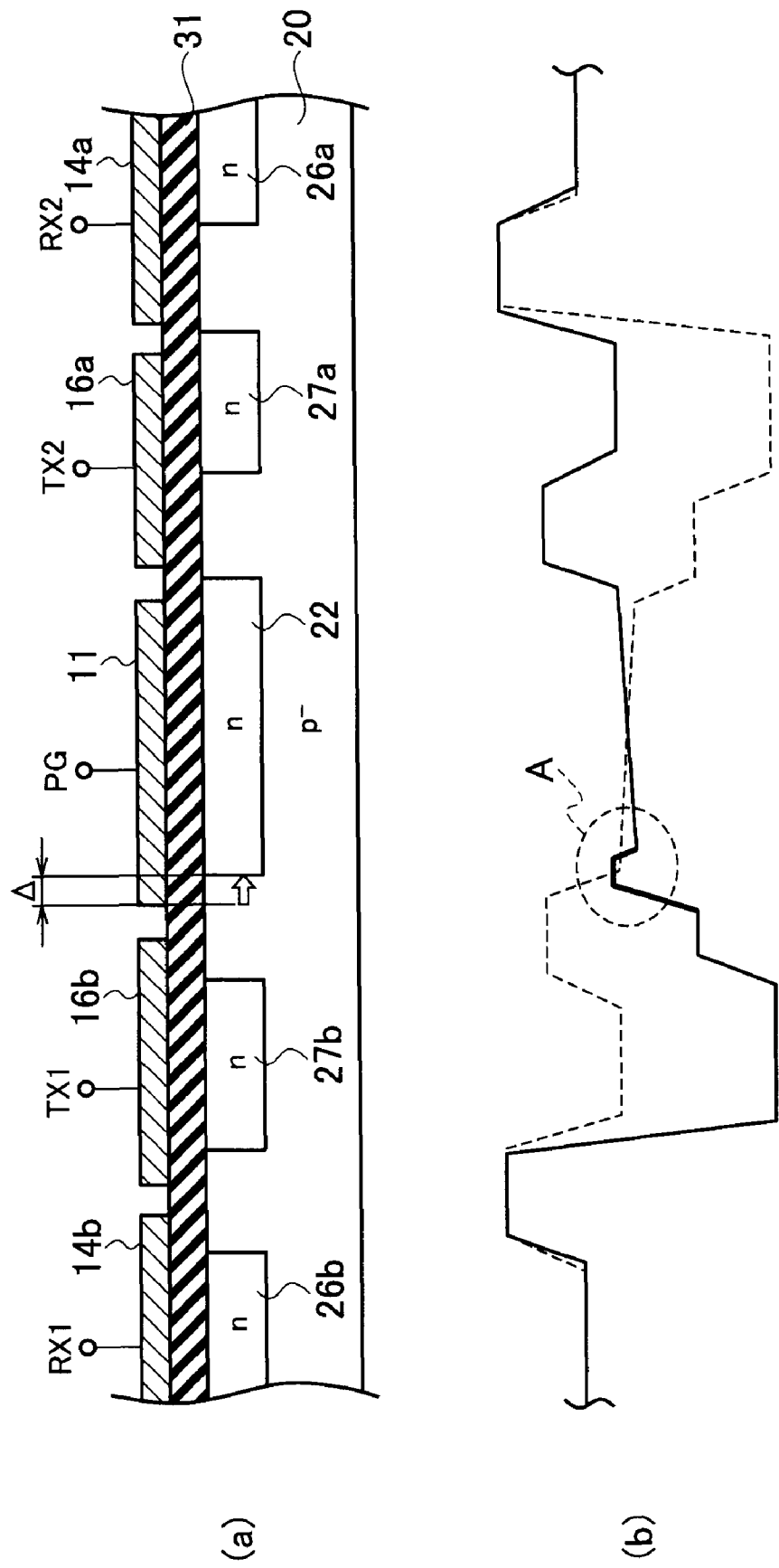
FIG. 9 (a) shows, as one example, a case when the pattern positions of the buried charge-generation region, the first buried charge-transfer region, the second buried charge-transfer region, the first buried charge read-out region and the second buried charge read-out region are shifted rightward by delta, against the pattern positions of the light receiving gate electrode, the first transfer gate electrode, the second transfer gate electrode, the first read-out gate electrode and the second read-out gate electrode.

FIG. 9 (a) shows, as one example, a case in which the pattern positions of the buried charge-generation region 22 of n-type, the first buried charge-transfer region 27b, the second buried charge-transfer region 27a, the first buried charge read-out region 26b and the second buried charge read-out region 26a are shifted rightward by delta against the pattern positions of the light receiving gate electrode 11, the first transfer gate electrode 16b, the second transfer gate electrode 16a, the first read-out gate electrode 14b and the second read-out gate electrode 14a.

As shown in FIG. 9 (a), when the p-region portion absent of n-layer is generated under the light receiving gate electrode 11 at the left edge of the light receiving gate electrode 11, as indicated by and surrounded with the dashed circle in FIG. 9 (b), the potential becomes shallow in the A-portion, and a barrier is generated. Thus, at a drive mode at which the charges are transferred from the buried charge-generation region 22 to the first buried charge-transfer region 27b, from the right side to the left side, a transfer failure is generated.

Similarly, (although not shown), when the pattern positions of the buried charge-generation region 22, the first buried charge-transfer region 27b, the second buried charge-transfer region 27a, the first buried charge read-out region 26b and the second buried charge read-out region 26a are shifted leftward by delta against the pattern positions of the light receiving gate electrode 11, the first transfer gate electrode 16b, the second transfer gate electrode 16a, the first read-out gate electrode 14b and the second read-out gate electrode 14a, the barrier is generated on the right side of the light receiving gate electrode 11. Then, at a drive mode at which the charges are transferred from the buried charge-generation region 22 to the second buried charge-transfer region 27a, from the left side to the right side, a transfer failure is generated.

According to the solid-state imaging device pertaining to the second embodiment of the present invention, the positions of the edges of the first transfer-barrier region 37b, the second transfer-barrier region 37a, the first charge-read-out barrier region 38b and the second charge-read-out barrier region 38a of the first conductivity type (p-type), serving as the transfer-direction establishing region, and the positions of the edges of the light receiving gate electrode 11, the first transfer gate electrode 16b and the second transfer gate electrode 16a can be delineated by the self-alignment technology. Thus, the barrier shown in FIG. 9 (b) is never generated. Hence, at the drive mode at which the charges are transferred from the buried charge-generation region 22 to the first buried charge-transfer region 27b, or from the buried charge-generation region 22 to the second buried charge-transfer region 27a, the transfer failure is never generated.

<Manufacturing Method of Semiconductor Range-Finding Element and Solid-State Imaging Device>

The manufacturing method of the semiconductor range-finding element and the solid-state imaging device pertaining to the second embodiment of the present invention will be described below by using FIG. 10 to FIG. 12. By the way, the manufacturing method of the semiconductor range-finding element and the solid-state imaging device, which will be described below, are one example. Then, using the various manufacturing methods other than the method described below, including the variation example, can naturally establish the manufacturing method of the semiconductor range-finding element and the solid-state imaging device.

(a) At first, an epitaxial substrate, in which a p-type silicon epitaxial growth layer 20 having impurity concentration of about $6 \times 10^{13}$ to $1.5 \times 10^{15}$ cm$^{-3}$ or less is formed at a thickness of about 4 to 20 micrometers on a p-type semiconductor substrate 19 whose main surface is (100) plane of about 0.07 to 0.0012 ohm-cm (the impurity concentration is between about $8 \times 10^{17}$ cm$^{-3}$ and about $1 \times 10^{20}$ cm$^{-3}$) is prepared. After a thermal oxide film (SiO$_2$) of about 150 nm is formed on the main surface of p-type silicon epitaxial growth layer 20, a photo resist film is coated, and the photo resist film is delineated by a photolithography technique so as to open a p-well formation region in the photo resist film. Next, boron ions ($^{11}$B$^+$) of dose amount of about $10^{12}$ to $10^{13}$ cm$^{-2}$ are implanted through the thermally oxidized film into the p-well formation region. Next, the portion of the well formation region of the thermally oxidized film is etched and removed. Also, after the photo resist film is removed and a predetermined cleaning step is completed, the implanted boron ions are thermally diffused at about 1200 degree centigrade, and as shown in FIG. 10(a), p-wells 25 are formed. Simultaneously, another p-wells 25 are formed on the peripheral circuit (not shown) and the voltage-read-out buffer amplifier 82 assigned in each pixel X$_{ij}$. Also, n-wells are similarly formed on the peripheral circuit (not shown). Moreover, after all of the thermally oxidized films on the main surfaces of p-type silicon epitaxial growth layers 20 are removed or stripped, a pad oxide film (SiO$_2$) having a film thickness of about 100 nm is again formed on the main surface of the silicon epitaxial growth layer 20 by thermally oxidizing method. After that, the CVD method is used to grow a nitride film (Si$_3$N$_4$) 34 having a film thickness of about 200 nm. The photo resist film delineated by the photolithography technique is formed on the nitride film 34, and with the photo resist film as a mask, a reactive ion etching (RIE) is performed so as to delineate a mask of the nitride film 34 for selective oxidization (LOCOS). Then, the LOCOS method is used to form the field oxide film 31 having a thickness between about 150 nm and about 1000 nm and between about 200 nm and about 400 nm, in the window portion of the nitride film 34, as shown in FIG. 10 (a). The nitride film 34 covering the element formation region is used as the oxidization protection film, because the oxidization rate of nitride film is very slow as compared with silicon.

(b) Next, a photo resist film 51 delineated by the photolithography technique is formed. Then, with the photo resist film 51 as the mask, as shown in FIG. 10 (b), phosphorous ions ($^{31}$P$^+$) of dose amount of about $6 \times 10^{10}$ to $3 \times 10^{11}$ cm$^{-2}$ are implanted into the p-type silicon epitaxial growth layer 20. Then, the ion-implanted layer for the surface buried region is formed in and at the surface of p-type silicon epitaxial growth layer 20. After that, when the photo resist film is removed and activation-anneal process is performed, as shown in FIG. 10 (c), the surface buried region 28 is formed on the interface between the field oxide film 31 and the p-type silicon epitaxial growth layer 20.

(c) Next, after the removal of the nitride film 34, a dummy oxide film having a film thickness of several 10 nm is formed on the element formation region. Next, a gate threshold voltage control (V$_{th}$ control) ion-implantation is performed. At first, by the photolithography technique, the p-well 25 on the peripheral circuit is covered with the photo resist film, and the impurities for the gate threshold voltage control of the pMOS are ion-implanted. Next, after the removal of the photo resist film, the pattern of the photo resist film is delineated on the region except the p-well 25, by the photolithography technique. In succession, simultaneously with the p-wells of the peripheral circuit and the voltage-read-out buffer amplifier 82, the impurity ions for the gate threshold voltage control of the NMOS are implanted into the p-well 25. After that, the photo resist film is removed. Moreover, the dummy oxide film used as the protecting film at the time of the $V_{th}$ control ion implantation is stripped. Moreover, the surface of the p-well 25 is thermally oxidized to form a gate oxide film 32. Moreover, as shown in FIG. 11 (d), a polysilicon film 61 is deposited at about 200 to 400 nm on the entire surface of the gate oxide film 32, by the CVD method. Moreover, a nitride film 62 serving as a shielding film is deposited at about 80 to 150 nm. Here, "the shielding film" is not limited to the nitride film 62, and the shielding film may be a film having a sufficiently high etch selectivity against electrode materials, at the time of the electrode patterning which will be described later.

(d) Then, a photo resist film 52 delineated by the photolithography technique is formed on the nitride film (shielding film) 62. Then, with the photo resist film 52 as the mask, the reactive ion etching (RIE) and the like are carried out to etch the nitride film (shielding film) 62. Then, as shown in FIG. 11 (e), with the patterns of the photo resist film 52 and the nitride film (shielding film) 62 as the mask, the boron ions ($^{11}B^+$) are implanted at an order of dose amount of $10^{13}$ cm$^{-2}$ to $8 \times 10^{14}$ cm$^{-2}$. After that, the photo resist film 52 is removed. Then, when the activation-anneal process is performed, as shown in FIG. 11 (f), the first transfer-barrier region 37b, the second transfer-barrier region 37a, the first charge-read-out barrier region 38b and the second charge-read-out barrier region 38a of p-type are formed.

Figure 11:
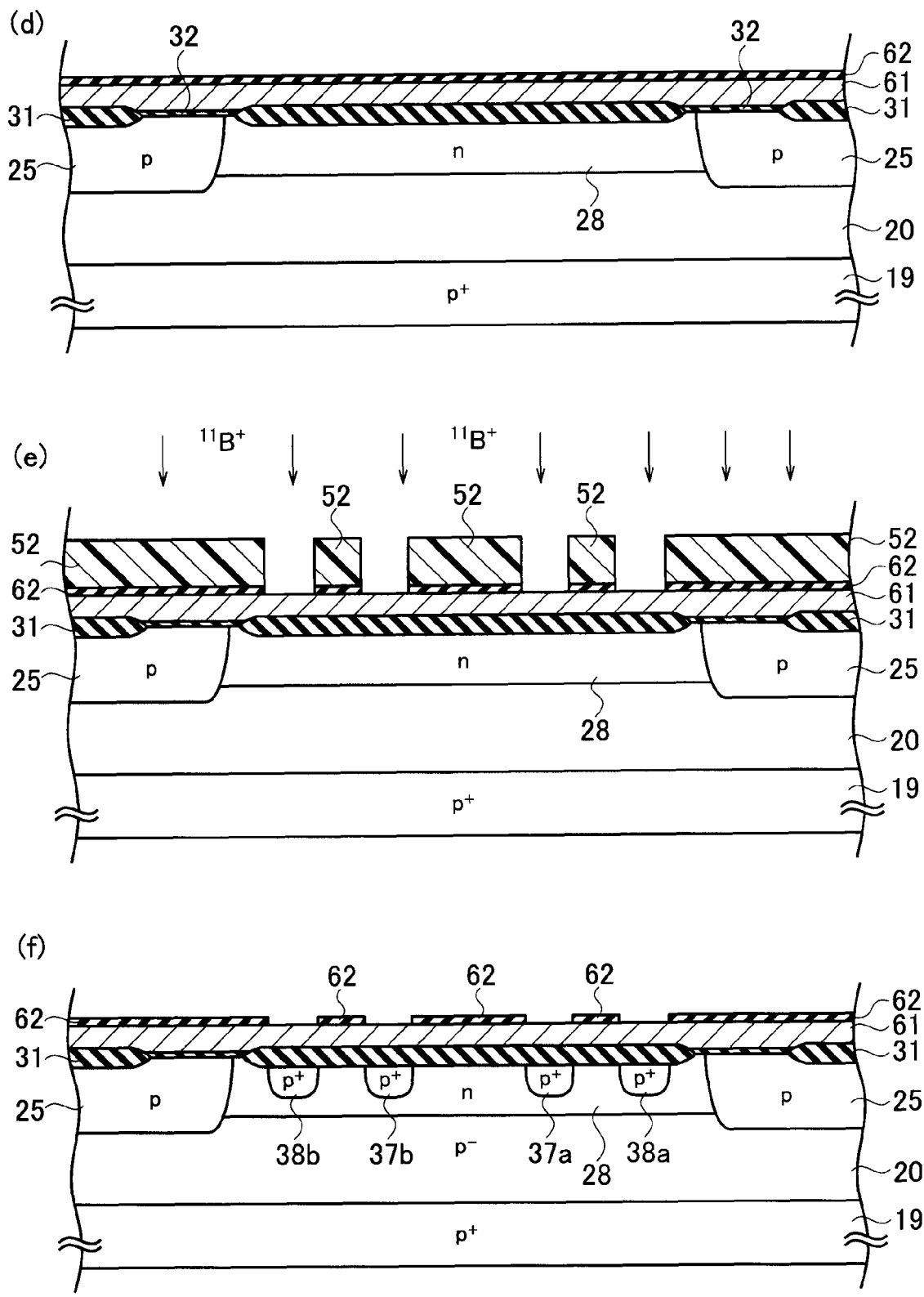
FIG. 11 is a step sectional view (No. 2) describing the manufacturing method of the semiconductor range-finding element and solid-state imaging device, pertaining to the second embodiment of the present invention.
Figure 12:
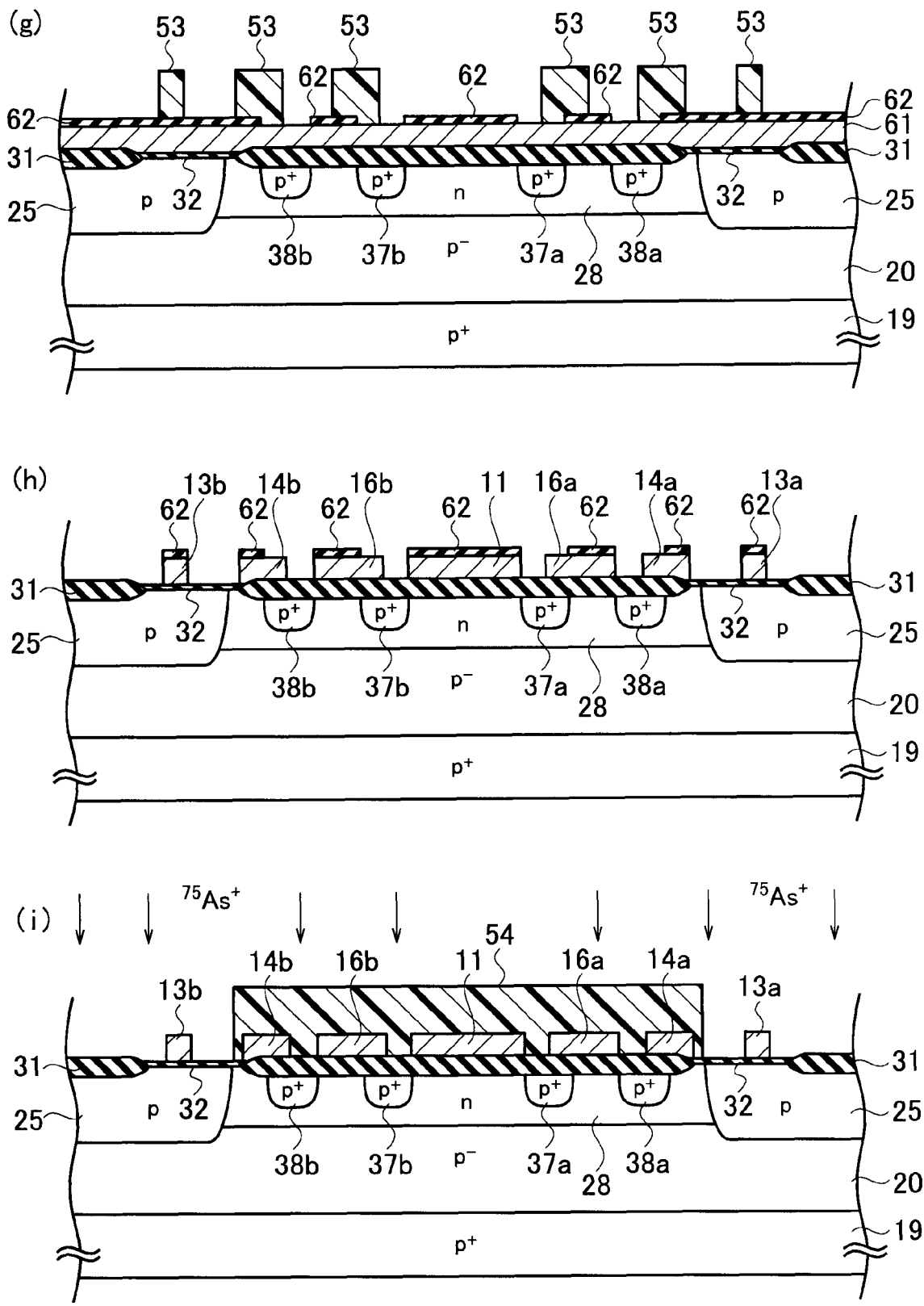
FIG. 12 is a step sectional view (No. 3) describing the manufacturing method of the semiconductor range-finding element and solid-state imaging device, pertaining to the second embodiment of the present invention.

(e) Then, a photo resist film 53 delineated by the photolithography technique is formed on the nitride film (shielding film) 62, as shown in FIG. 11 (g). Then, with the photo resist film 53 as the mask, the polysilicon film 61 is etched by the RIE and the like. After that, when the photo resist film 53 is removed, as shown in FIG. 12 (h), the patterns of the light receiving gate electrode 11, the first transfer gate electrode 16b, the second transfer gate electrode 16a, the first read-out gate electrode 14b, the second read-out gate electrode 14a, the first reset gate electrode 13b and the second reset gate electrode 13a are delineated.

(f) Next, by photolithography technique, another photo resist film 54 is covered on regions other than the p-well 25. Then, as shown in FIG. 12 (i), employing the first reset gate electrode 13b and the second reset gate electrode 13a as the masks, arsenic ions ($^{75}As^+$) are implanted into the p-well 25 at an order of $10^{15}$ cm$^{-2}$ by self-alignment methodology. Simultaneously, arsenic ions ($^{75}As^+$) are similarly implanted into the p-wells of the peripheral circuit and the voltage-read-out buffer amplifier 82, with the polysilicon gate electrode as the mask. Simultaneously, the arsenic ions ($^{75}As^+$) are implanted into the first reset gate electrode 13b and the second reset gate electrode 13a made of polysilicon and other polysilicon gate electrodes such as the polysilicon gate electrodes disposed on p-well of the peripheral circuit (not shown). After that, when the photo resist film 54 is removed and the activation-anneal process is performed on the p-type semiconductor substrate 19, the first floating diffusion region 23b, the second floating diffusion region 23a, the first reset drain region 24b and the second reset drain region 24a are formed on the p-well 25, as shown in FIG. 8. Similarly, the n-type source/drain region is formed on the p-well of the peripheral circuit although they are not shown. Simultaneously, the arsenic ions ($^{75}As^+$), which are implanted into the first reset gate electrode 13b and the second reset gate electrode 13a, are also activated. Thus, the resistivity of the first reset gate electrode 13b and the second reset gate electrode 13a are decreased.

(g) Next, although the illustration is omitted, inter-layer insulating films are deposited, in order to insulate between the vertical signal lines and horizontal scanning lines for connecting the respective pixels, between the metallic inter-connections for connecting respective transistors in the peripheral circuit, and between the metallic inter-connections and the polysilicon films implementing the gate electrodes. As the inter-layer insulating film, it is possible to use the various dielectric films, such as the composite film implemented by the double-level structure of an oxide film (CVD-SiO$_2$) deposited by CVD method having a film thickness of about 0.5 micrometer and a PSG film or BPSG film deposited on the oxide film (CVD-SiO$_2$) by CVD method having a film thickness of about 0.5 micrometer. After the deposition by CVD method, the composite film is thermally annealed. Thus, the BPSG film in the upper layer of the composite film is reflowed, and the surface of the inter-layer insulating film is made flat. On the surface, a photo resist film delineated by photolithography technique is formed, and using the photo resist film as a mask, and the inter-layer insulating film is etched by the RIE or ECR ion-etching and the like, and a contact hole to connect the metallic interconnections and the transistor is cut. After that, the photo resist film used to cut the contact hole is removed. Next, a sputtering method or electron beam vacuum evaporation method or the like is used to deposit the aluminum alloy film (Al—Si, Al—Cu—Si) including silicon and the like. Thereon, photolithography technique delineates a mask with the photo resist film, and by using the mask, the aluminum alloy film is delineated by the RIE. Such sequential processes are sequentially repeated. Consequently, the vertical signal line and horizontal scanning line to connect the respective pixels, or the metallic interconnections to connect between the respective transistors in the peripheral circuit are formed. Moreover, a different inter-layer insulating film is deposited on the metallic interconnections, and the photolithography technique is used to form the metallic film arranging openings just over the light receiving gate electrode s11 of each pixel, and the metallic film is delineated so as to define the light shielding film. Then, when the passivation film having a film thickness of about one micrometer, which is intended to protect the mechanical damage and protect the immersion of the water and the impurities, is laminated on the light shielding film by CVD method, the solid-state imaging device pertaining to the second embodiment of the present invention is completed. The PSG film, the nitride film and the like are used as the passivation film.

As mentioned above, according to the manufacturing method of the semiconductor range-finding element and solid-state imaging device related to the second embodiment of the present invention, the positions of the edges serving as the transfer-direction establishing region that is implemented by the first transfer-barrier region 37b of p-type, the second transfer-barrier region 37a, the first charge-read-out barrier region 38b and the second charge-read-out barrier region 38a, and the positions of the edges of the light receiving gate electrode 11, the first transfer gate electrode 16b and the second transfer gate electrode 16a can be formed by self-alignment methodology. Thus, the barrier shown in FIG. 9 (b) is never generated. Hence, at the drive mode at which the charges are transferred from the buried charge-generation region 22 to the first buried charge-transfer region 27b, or from the buried charge-generation region 22 to the second buried charge-transfer region 27a, the transfer failure is never generated.

Moreover, the formation of the surface buried region 28 of n-type, the first transfer-barrier region 37b, the second transfer-barrier region 37a, the first charge-read-out barrier region 38b and the second charge-read-out barrier region 38a of p-type can be attained by adding the simple steps, such as ion-implantation processes and the like, as the additional step to the manufacturing step of the standard CMOS image sensor. Thus, according to the manufacturing method of the semiconductor range-finding element and solid-state imaging device related to the second embodiment of the present invention, the TOF type range-finding image sensor in which the high speed signal transfer can be carried out similarly to the CCD can be achieved by the standard CMOS process, while keeping the standard CMOS process as the basic process.

Also, similarly to the description in the first embodiment, according to the semiconductor range-finding element pertaining to the second embodiment, the potential well structure similar to the first embodiment is created by the first transfer-barrier region 37b, the second transfer-barrier region 37a, the first charge-read-out barrier region 38b and the second charge-read-out barrier region 38a which are provided in the surface buried region 28. Thus, the transfer channel through which the electrons (the signal charges) are transferred is buried in the deep position, which is close to the interface between the p-type silicon epitaxial growth layer 20 and the n-type surface buried region 28, and the transfer channel is not disposed in the interface between the semiconductor region and the insulating film 31. Thus, the electrons (the signal charges) are never captured by interface states. If the electrons (the signal charges) are captured by interface states, they are discharged after the elapse of a time, and the response is delayed, which reduces the distance resolution. In particular, since the negative bias is applied to the light receiving gate electrode 11, the dark current generated at interface states between the semiconductor region and the insulating film 31 is reduced. Also, it is possible to protect the electrons generated by the optical pulse from being trapped by the interface states and protect the response from being delayed.

Also, because the first transfer gate electrode 16b and the second transfer gate electrode 16a are applied with the negative pulse so that the dark current is not accumulated to the signal electrons accumulated in the potential well just under the first transfer gate electrode 16b and the second transfer gate electrode 16a, the holes are periodically accumulated at the surfaces of the surface buried region 28 just under the first transfer gate electrode 16a and the second transfer gate electrode 16b. Hence, the dark current can be reduced.

Moreover, the read-out operation of the semiconductor range-finding element pertaining to the second embodiment is carried out by using the first read-out gate electrode 14b and the second read-out gate electrode 14a and transferring the charges to the first floating diffusion region 23b and the second floating diffusion region 23a. Thus, it is possible to ignore the dark currents generated in the first floating diffusion region 23b and the second floating diffusion region 23a. Moreover, similarly to the first embodiment, the correlated double sampling circuit provided in the column can be used to cancel the reset noise that are generated in the first floating diffusion region 23b and the second floating diffusion region 23a. Hence, a lower noise performance is achieved, and the distance resolution in low illumination regime is improved.

Moreover, when the first floating diffusion region 23b and the second floating diffusion region 23a and the read-out transistor are common, the number of the transistors assigned in each pixel can be decreased, and, since the charge detection can be carried out in the same diffusion layer, the characteristics such as the conversion gain and the like can be made equal, thereby improving the precision.

Moreover, when the semiconductor range-finding elements pertaining to the second embodiment are arrayed in the shape of the two-dimensional matrix as shown in FIG. 1, because a low cost and high distance resolution performance with a simple structure is achieved by the semiconductor range-finding elements, it is possible to attain the TOF type range-finding image sensor in which the large number of the pixels are arranged so as to establish a high space resolution.

Third Embodiment

The entire structure of the solid-state imaging device (two-dimensional image sensor) pertaining to the third embodiment of the present invention is basically equal to the block diagram shown in FIG. 1. Thus, the duplex explanations are omitted.

The sectional structure of the semiconductor range-finding element serving as the TOF pixel circuit 81 assigned in each of the pixels $X_{11}$ to $X_{1m}$; $X_{21}$ to $X_{2m}$; - - - ; $X_{n1}$ to $X_{nm}$ in the solid-state imaging device pertaining to the third embodiment is basically similar to the sectional structure of the semiconductor range-finding element pertaining to the first embodiment. However, the planar layout differs from the planar configuration of the semiconductor range-finding element pertaining to the first embodiment. That is, in the first embodiment, as shown in FIG. 2, the pixel structure is illustrated in which the first transfer gate electrode 16b and the second transfer gate electrode 16a are provided on both of the sides of the light receiving gate electrode 11, and the charges generated by the optical pulse are delivered to the left and right sides. However, in the solid-state imaging device (semiconductor range-finding element) pertaining to the third embodiment, the light receiving gate electrode 11 is arranged near the left side in FIG. 13 (a), and the first transfer gate electrode 16b and the second transfer gate electrode 16a, which transfer the signal charges generated by the semiconductor photoelectric conversion element alternately in two rows, or upper and lower rows, are arranged in the right side of the light receiving gate electrode 11. Moreover, the first read-out gate electrode 14b is arranged on the right side of the first transfer gate electrode 16b in the upper stage (upper row), and the second read-out gate electrode 14a is arranged on the right side of the second transfer gate electrode 16a in the lower stage (lower row).

The first floating diffusion region 23b for accumulating the signal charges, which are transferred sequentially in turn from the first transfer gate electrode 16b and the first read-out gate electrode 14b, is arranged on the right side of the first read-out gate electrode 14b in the upper stage. Moreover, the first reset gate electrode 13b and the first reset drain region 24b facing to the first floating diffusion region 23b through the first reset gate electrode 13b are arranged adjacent to the right side of the first floating diffusion region 23b.

On the other hand, the second floating diffusion region 23a for accumulating the signal charges, which are transferred sequentially in turn from the second transfer gate electrode 16a and the second read-out gate electrode 14a, is arranged on the right side of the second read-out gate electrode 14a in the lower stage. Moreover, the second reset gate electrode 13a and the second reset drain region 24a facing to the second floating diffusion region 23a through the second reset gate electrode 13a are arranged adjacent to the right side of the second floating diffusion region 23a.

The MOS transistor serving as the first reset transistor is implemented by the first floating diffusion region 23b, the first reset gate electrode 13b and the first reset drain region 24b, which are in the upper stage, and the MOS transistor serving as the second reset transistor is implemented by the second floating diffusion region 23a, the second reset gate electrode 13a and the second reset drain region 24a, which are in the lower stage. For the respective first reset gate electrode 13b and second reset gate electrode 13a, the control signals R are all set at the high (H) level, and the charges accumulated in the first floating diffusion region 23b and the second floating diffusion region 23a are discharged to the first reset drain region 24b and the second reset drain region 24a, respectively, and the first floating diffusion region 23b and the second floating diffusion region 23a are reset.

FIG. 13 (b) shows a cross-sectional view when viewed from the B-B direction in FIG. 13 (a), namely, the cross-sectional view when the first transfer gate electrode 16b and the first read-out gate electrode 14b in the upper stage are cut, and shows the semiconductor substrate 19 of the first conductivity type (p-type), the semiconductor layer (epitaxial growth layer) 20 of the first conductivity type (p-type) arranged on the semiconductor substrate 19, and the buried charge-generation region 22 of the second conductivity type (n-type) arranged on the semiconductor layer (epitaxial growth layer) 20. The semiconductor photoelectric conversion element is implemented by the insulating film 31 just under the light receiving gate electrode 11 shown on the left side, the buried charge-generation region 22, the semiconductor layer (epitaxial growth layer) 20, and the semiconductor substrate 19. A part of the semiconductor layer (epitaxial growth layer) 20 of the first conductivity type (p-type) located just under the light receiving gate electrode 11 serves as the charge generation region of the semiconductor photoelectric conversion element. The carriers (electrons) generated in the charge generation region are injected into a part of the buried charge-generation region 22 just over the charge generation region. FIG. 13 (b) shows a configuration in which the insulating film 31 extends from just under the light receiving gate electrode 11, rightward, through the first transfer gate electrode 16b, to under the first read-out gate electrode 14b. However, as understood from FIG. 13 (a), the insulating film 31 similarly extends from just under the light receiving gate electrode 11, rightward, through the second transfer gate electrode 16a, to under the second read-out gate electrode 14a.

The buried charge-generation region 22 is arranged just under the light receiving gate electrode 11 through the insulating film 31, and the first buried charge-transfer region 27b and the second buried charge-transfer region 27a are arranged in parallel just under the first transfer gate electrode 16b and the second transfer gate electrode 16a, which are located in the right direction of the buried charge-generation region 22, respectively (FIG. 13 (b) shows only the side of the first buried charge-transfer region 27b). Moreover, the first buried charge read-out region 26b and the second buried charge read-out region 26a are arranged in parallel just under the first read-out gate electrode 14b and the second read-out gate electrode 14a in the right direction of the first buried charge-transfer region 27b and the second buried charge-transfer region 27a, through the insulating film 31 (FIG. 13 (b) shows only the side of the first buried charge read-out region 26b). As understood from FIG. 13 (a), the first buried charge read-out region 26b and the second buried charge read-out region 26a are formed so as to metallurgically contact with (join to) the first floating diffusion region 23b and the second floating diffusion region 23a, respectively. The first floating diffusion region 23b and the second floating diffusion region 23a are the semiconductor regions that are higher in impurity concentration than the buried charge-generation region 22, the first buried charge-transfer region 27b, the second buried charge-transfer region 27a, the first buried charge read-out region 26b and the second buried charge read-out region 26a, respectively.

The portion located just under the first transfer gate electrode 16b between the buried charge-generation region 22 and the first buried charge-transfer region 27b serves as the first transfer channel, and the portion located just under the second transfer gate electrode 16a between the buried charge-generation region 22 and the second buried charge-transfer region 27a serves as the second transfer channel. That is, the first transfer gate electrode 16b and the second transfer gate electrode 16a electrostatically control the potentials in the first and second transfer channels through the insulating films 31 formed on the upper portions of the first and second transfer channels, respectively, as shown on the potential diagrams of the right halves in FIG. 4 and FIG. 5. Since the potentials in the first and second transfer channels are electrostatically controlled, the signal charges are transferred through the first and second transfer channels alternately in the parallel directions in the two stages (two rows), respectively. As a result, the signal charges are transferred to and accumulated in the first buried charge-transfer region 27b of the second conductivity type (n-type) and the second buried charge-transfer region 27a in the two stages (two rows) in the parallel directions, respectively.

The first floating diffusion region 23b and the second floating diffusion region 23a are short-circuited through the connection wiring such as the surface wiring and the buried wiring (buried layer) and the like. As shown in FIG. 13 (a), the gate electrode of the signal read-out transistor (amplification transistor) MA1 implementing the voltage-read-out buffer amplifier 82 is connected as the common terminal between the first floating diffusion region 23b and the second floating diffusion region 23a. An n-type semiconductor region 73 serving as the drain terminal of the signal read-out transistor (amplification transistor) MA1 is connected to the power source VDD, and an n-type semiconductor region 72 serving as a source terminal doubly acts as a drain terminal of the switching transistor MS1 for the pixel selection is connected to the vertical signal line, and the selecting control signal S of the horizontal line is given to the gate electrode from the vertical shift register and vertical scanning circuit 95.

When the selecting control signal S is set to the high level, the switching transistor MS1 is turned on, and the currents corresponding to the potentials of the first floating diffusion region 23b and the second floating diffusion region 23a, which are amplified by the signal read-out transistor (amplification transistor) MA1, flow in turn through the vertical signal line in time series.

In the third embodiment of the present invention, similarly to the first embodiment, the first exhaustion gate electrode 12a and the second exhaustion gate electrode 12b are provided in the upper and lower direction of the plan view in FIG. 13, in order to remove the influence of the background light. That is, the background-light charges are exhausted through the first exhaustion gate electrode 12a and the second exhaustion gate electrode 12b to the first exhaustion drain region 21a and the second exhaustion drain region 21b, which serve as exhausting outlets. The operation mechanism is carried out identically to the description of the first embodiment in which, when the control pulse signal TX1 is given to the first transfer gate electrode 16b, the control pulse signal TX2 is given to the second transfer gate electrode 16a, and the signal charges are distributed to the left and right portions, the negative voltage (for example, TXD=−2 V) is applied to the first exhaustion gate electrode 12a and the second exhaustion gate electrode 12b, and then the potential barrier is formed such that the charges are not transferred to the first exhaustion drain region 21a and the second exhaustion drain region 21b, and when the background-light charges are scheduled to be exhausted, the high potential (for example, 1 V) is applied to the first exhaustion gate electrode 12a and the second exhaustion gate electrode 12b so that the transferring of the background-light charges to the first exhaustion drain region 21a and the second exhaustion drain region 21b is made easier.

The impurity concentrations and thicknesses (depths) of the semiconductor layer 20, the semiconductor substrate 19, the first buried charge-transfer region 27b, the second buried charge-transfer region 27a, the first buried charge read-out region 26b and the second buried charge read-out region 26a are identical to the description of the first embodiment. Thus, the duplexes explanations are omitted.

The operations of the semiconductor range-finding element (two-dimensional image sensor) pertaining to the third embodiment of the present invention are basically equal to the operations of the semiconductor range-finding element pertaining to the first embodiment described by using FIG. 7. Thus, the explanations of the duplex operations are omitted.

As described above, according to the semiconductor range-finding element pertaining to the third embodiment, similarly to the semiconductor range-finding element pertaining to the first embodiment, the buried charge-generation region 22, the first buried charge-transfer region 27b, the second buried charge-transfer region 27a, the first buried charge read-out region 26b and the second buried charge read-out region 26a are formed as the island-shaped n-type surface buried regions. Thus, the transfer channel through which the electrons (the signal charges) are transferred is buried in the deep position, which is close to the interface between the p-type silicon epitaxial growth layer 20 and the n-type buried charge-generation region 22, and the transfer channel is not disposed in the interface between the semiconductor region and the insulating film 31. Thus, the electrons (the signal charges) are never captured by interface states. If the electrons (the signal charges) are captured by interface states, they are discharged after the elapse of a time, and the response is delayed, which reduces the distance resolution. In particular, since the negative bias is applied to the light receiving gate electrode 11, the dark current generated at interface states between the semiconductor region and the insulating film 31 is reduced. Also, it is possible to protect the electrons generated by the optical pulse from being trapped by the interface states and protect the response from being delayed.

Also, because the first transfer gate electrode 16b and the second transfer gate electrode 16a are applied with negative pulse so that the dark current is not accumulated to the signal electrons accumulated in the first buried charge-transfer region 27b and the second buried charge-transfer region 27a, similarly to the semiconductor range-finding element pertaining to the first embodiment, the holes are periodically accumulated on the surfaces of the first buried charge-transfer region 27b and the second buried charge-transfer region 27a under the first transfer gate electrode 16a and the second transfer gate electrode 16b. Hence, the dark current can be reduced.

Moreover, the read-out operation of the semiconductor range-finding element pertaining to the third embodiment is carried out by using the first read-out gate electrode 14b and the second read-out gate electrode 14a and transferring the charges to the first floating diffusion region 23b and the second floating diffusion region 23a, similarly to the semiconductor range-finding element pertaining to the first embodiment. Thus, it is possible to ignore the dark currents generated in the first floating diffusion region 23b and the second floating diffusion region 23a. Moreover, the correlated double sampling circuit provided in the column can be used to cancel the reset noise that are generated in the first floating diffusion region 23b and the second floating diffusion region 23a. Hence, a lower noise performance is achieved, and the distance resolution in low illumination regime is improved.

Also, in the semiconductor range-finding element pertaining to the third embodiment, the first floating diffusion region 23b and the second floating diffusion region 23a and the read-out transistor can be common so that the number of the transistors assigned in each pixel can be decreased, and, since the charge detection is carried out in the same diffusion layer, the characteristics such as the conversion gain and the like can be made equal, thereby improving the precision.

Moreover, similarly to the semiconductor range-finding element pertaining to the first embodiment, in each of the pixels, the predetermined voltages are applied to the first exhaustion gate electrode 12a and the second exhaustion gate electrode 12b, and the background-light charges are transferred to the first exhaustion drain region 21a and the second exhaustion drain region 21b, and the influence of the background light can be suppressed. Thus, the shot noise caused by the background-light charges can be suppressed, thereby achieving a high distance measurement precision (distance resolution) and the maximal distance measurement range. In particular, in each of the pixels, it is possible to protect the background-light charges from being accumulated in the first buried charge-transfer region 27b and the second buried charge-transfer region 27a, and it is possible to use full capacities of the first buried charge-transfer region 27b and the second buried charge-transfer region 27a and accumulate the signal charges. Hence, the wide dynamic range can be attained. Moreover, when the dynamic range is represented by the maximal value of the signals and the noise level, the noise caused by the background-light charges is decreased, thereby increasing the dynamic range.

Moreover, when the semiconductor range-finding elements pertaining to the third embodiment are arrayed in the shape of the two-dimensional matrix shown in FIG. 1, because low cost and high distance resolution performance are obtained by the semiconductor range-finding elements having a simple structure, it is possible to attain the TOF type range-finding image sensor, in which a large number of pixels are arranged and the space resolution is high.

By the way, the solid-state imaging device pertaining to the third embodiment may be designed as two read-out amplifier systems such that two read-out amplifiers are respectively assigned to the first floating diffusion regions 23b and the second floating diffusion regions 23a so as to facilitate the parallel read-out operation. The parallel read-out operation in two read-out amplifier systems is advantageous in the read-out speed. Although the read-out timing differs from FIG. 7 and the configuration of the noise canceling circuit differs from FIG. 1, only a change such that the two signals can be sampled simultaneously is required to perform the scheme of the two read-out amplifier systems.

Fourth Embodiment

In FIG. 14, as the solid-state imaging device pertaining to the fourth embodiment, a structure in which transferring of the charges from the light receiving gate electrode 11 to the first transfer gate electrode 16b and the second transfer gate electrode 16a or to the first floating diffusion region 23b and the second floating diffusion region 23a is made easier while the maximal accumulation amount of the signal charges is increased is shown, comparing with the structure of the solid-state imaging device pertaining to the third embodiment shown in FIG. 13.

The entire configuration of the solid-state imaging device (two-dimensional image sensor) pertaining to the fourth embodiment of the present invention is basically equal to the block diagram shown in FIG. 1. Thus, the duplex explanations are omitted. Also, the sectional structure of the semiconductor range-finding element serving as the TOF pixel circuit 81 assigned in each of the pixels $X_{11}$ to $X_{1m}$; $X_{21}$ to $X_{2m}$; - - - ; $X_{n1}$ to $X_{nm}$ in the solid-state imaging device pertaining to the fourth embodiment is basically similar to the sectional structure of the semiconductor range-finding element pertaining to the first and third embodiments. As for the planar layout, similarly to the planar configuration of the semiconductor range-finding element pertaining to the third embodiment, the light receiving gate electrode 11 is arranged near the left side of FIG. 14 (a), and the first transfer gate electrode 16b and the second transfer gate electrode 16a, which transfer the signal charges generated by the semiconductor photoelectric conversion element alternately in the upper and lower rows, or in two rows, are arranged in the right side of the light receiving gate electrode 11. However, geometry of pattern differs from the planar configuration of the semiconductor range-finding element pertaining to the third embodiment.

That is, as shown in FIG. 14 (a), the light receiving gate electrode 11 has the shape of a heptagon corresponding to the formation in which in the trapezoid having the oblique sides symmetrical with each other and the rectangle having the long sides longer than the bottom side of the trapezoid, the long side of the rectangle is mated with the bottom side of the trapezoid.

Then, each of the first transfer gate electrode 16b and the second transfer gate electrode 16a exhibits the shape of a broadax that has an oblique side facing to the oblique side of the light receiving gate electrode 11. That is, the first transfer gate electrode 16b and the second transfer gate electrode 16a are arranged such that the blades of the two broadaxes are facing to each other.

Moreover, the first read-out gate electrode 14b and the second read-out gate electrode 14a that are respectively rectangular are arranged in the space which can be provided in the portion of the hilts of the pair of broadaxes opposite to each other. In this way, the first read-out gate electrode 14b is arranged on the right side of the first transfer gate electrode 16b in the upper stage (upper row), and the second read-out gate electrode 14a is arranged on the right side of the second transfer gate electrode 16a in the lower stage (lower row).

The first floating diffusion region 23b for accumulating the signal charges, which are transferred sequentially in turn by the first transfer gate electrode 16b and the first read-out gate electrode 14b, is arranged on the right side of the first read-out gate electrode 14b in the upper stage. The second floating diffusion region 23a for accumulating the signal charges, which are transferred sequentially in turn by the second transfer gate electrode 16a and the second read-out gate electrode 14a, is arranged on the right side of the second read-out gate electrode 14a in the lower stage.

The MOS transistor serving as the first reset transistor is implemented by the first floating diffusion region 23b in the upper stage and the first reset gate electrode and the first reset drain region, which are not shown. The MOS transistor serving as the second reset transistor is implemented by the second floating diffusion region 23a in the lower stage and the second reset gate electrode and the second reset drain region, which are not shown.

The first floating diffusion region 23b and the second floating diffusion region 23a are short-circuited through the connection wiring such as the surface wiring and the buried wiring (buried layer) and the like. As shown in FIG. 14 (a), the gate electrode of the signal read-out transistor (amplification transistor) MA implementing the voltage-read-out buffer amplifier 82 is connected as the common terminal between the first floating diffusion region 23b and the second floating diffusion region 23a. The drain electrode of the signal read-out transistor (amplification transistor) MA is connected to the power source VDD, and the source electrode is connected to the drain electrode of the switching transistor MS for the pixel selection. The source electrode of the switching transistor MS for the pixel selection is connected to the vertical signal line $B_j$, and the selecting control signal S of the horizontal line is given to the gate electrode from the vertical shift register and vertical scanning circuit 95. When the selecting control signal S is set to the high level, the switching transistor MS is turned on, and the currents corresponding to the potentials of the first floating diffusion region 23b and the second floating diffusion region 23a, which are amplified by the signal read-out transistor (amplification transistor) MA, flow through the vertical signal line $B_j$ alternately and sequentially.

FIG. 14 (b) shows a cross-sectional view when viewed from the C-C direction in FIG. 14 (a), namely, the cross-sectional view when the first transfer gate electrode 16b and the first read-out gate electrode 14b in the upper stage are cut. However, the cross-sectional view is basically similar to FIG. 13 (b) and shows the semiconductor substrate 19 of the first conductivity type (p-type), the semiconductor layer (epitaxial growth layer) 20 of the first conductivity type (p-type) arranged on the semiconductor substrate 19, and the buried charge-generation region 22 of the second conductivity type (n-type) arranged on the semiconductor layer (epitaxial growth layer) 20. The insulating film 31 just under the light receiving gate electrode 11 shown on the left side, the buried charge-generation region 22, the semiconductor layer 20, and the semiconductor substrate 19 implements the semiconductor photoelectric conversion element.

The buried charge-generation region 22 is arranged just under the light receiving gate electrode 11 through the insulating film 31, and the first buried charge-transfer region 27b and the second buried charge-transfer region 27a are arranged in parallel just under the first transfer gate electrode 16b and the second transfer gate electrode 16a, which are located in the right direction of the buried charge-generation region 22, respectively (FIG. 14 (b) shows only the side of the first buried charge-transfer region 27b). Moreover, the first buried charge read-out region 26b and the second buried charge read-out region 26a are arranged in parallel just under the first read-out gate electrode 14b and the second read-out gate electrode 14a in the right direction of the first buried charge-transfer region 27b and the second buried charge-transfer region 27a, through the insulating film 31 (FIG. 14 (b) shows only the side of the first buried charge read-out region 26b). As understood from FIG. 14 (a), the first buried charge read-out region 26b and the second buried charge read-out region 26a are formed so as to metallurgically contact with (join to) the first floating diffusion region 23b and the second floating diffusion region 23a, respectively. The first floating diffusion region 23b and the second floating diffusion region 23a are the semiconductor regions that are higher in impurity concentration than the buried charge-generation region 22, the first buried charge-transfer region 27b, the second buried charge-transfer region 27a, the first buried charge read-out region 26b and the second buried charge read-out region 26a, respectively.

The portion located just under the first transfer gate electrode 16b between the buried charge-generation region 22 and the first buried charge-transfer region 27b serves as the first transfer channel, and the portion located just under the second transfer gate electrode 16a between the buried charge-generation region 22 and the second buried charge-transfer region 27a serves as the second transfer channel. That is, the first transfer gate electrode 16b and the second transfer gate electrode 16a electrostatically control the potentials in the first and second transfer channels through the insulating films 31 formed on the upper portions of the first and second transfer channels, respectively. Since the potentials in the first and second transfer channels are electrostatically controlled, the signal charges are transferred through the first and second transfer channels alternately in the parallel directions in the two stages (two rows), respectively. As a result, the signal charges are transferred to and accumulated in the first buried charge-transfer region 27b of the second conductivity type (n-type) and the second buried charge-transfer region 27a in the two stages (two rows) in the parallel directions, respectively.

In the fourth embodiment of the present invention, in order to remove the influence of the background light, a buried background-light-exhaustion region 29 and the exhaustion drain region 21, which serve as the exhausting outlets of the background-light charges, are provided in the vicinity of the left side of the plan view in FIG. 14. Then, the background-light charges are exhausted through the buried background-light-exhaustion region 29 to the exhaustion drain region 21. When the simplification of the process is considered, the buried background-light-exhaustion region 29 may be designed to have the same impurity concentration and thickness (depth) as the buried charge-generation region 22, the first buried charge-transfer region 27b, the second buried charge-transfer region 27a, the first buried charge read-out region 26b and the second buried charge read-out region 26a. Also, the exhaustion drain region 21 may be designed to have the same impurity concentration and thickness (depth) as the first floating diffusion region 23b and the second floating diffusion region 23a. The impurity concentrations and the thicknesses (depths) of the semiconductor layer 20, the semiconductor substrate 19, the buried charge-generation region 22, the first buried charge-transfer region 27b, the second buried charge-transfer region 27a, the first buried charge read-out region 26b and the second buried charge read-out region 26a are as described in the first embodiment. Thus, the duplex explanations are omitted.

The operations of the solid-state imaging device (two-dimensional image sensor) pertaining to the fourth embodiment of the present invention are basically identical to the operations of the solid-state imaging device pertaining to the first to third embodiments. Thus, the duplex operational explanations are omitted.

As mentioned above, according to the semiconductor range-finding element pertaining to the fourth embodiment, similarly to the semiconductor range-finding element pertaining to the first to third embodiments, the buried charge-generation region 22, the first buried charge-transfer region 27b, the second buried charge-transfer region 27a, the first buried charge read-out region 26b and the second buried charge read-out region 26a are formed as the island-shaped n-type surface buried regions. Thus, the transfer channel through which the electrons (the signal charges) are transferred is buried in the deep position, which is close to the interface between the p-type silicon epitaxial growth layer 20 and the n-type buried charge-generation region 22, and the transfer channel is not disposed in the interface between the semiconductor region and the insulating film 31. Thus, the electrons (the signal charges) are never captured by interface states. If the electrons (the signal charges) are captured by interface states, they are discharged after the elapse of a time, and the response is delayed, which reduces the distance resolution. In particular, since the negative bias is applied to the light receiving gate electrode 11, the dark current generated at interface states between the semiconductor region and the insulating film 31 is reduced. Also, it is possible to protect the electrons generated by the optical pulse from being trapped by the interface states and protect the response from being delayed.

Also, because the first transfer gate electrode 16b and the second transfer gate electrode 16a are applied with the negative pulse so that the dark current is not accumulated to the signal electrons accumulated in the first buried charge-transfer region 27b and the second buried charge-transfer region 27a, similarly to the semiconductor range-finding element pertaining to the first and third embodiments, the holes are periodically accumulated at the surfaces of the first buried charge-transfer region 27b and the second buried charge-transfer region 27a under the first transfer gate electrode 16a and the second transfer gate electrode 16b. Hence, the dark current can be reduced.

Moreover, because the read-out operation of the semiconductor range-finding element pertaining to the fourth embodiment is carried out by using the first read-out gate electrode 14b and the second read-out gate electrode 14a so as to transfer the charges to the first floating diffusion region 23b and the second floating diffusion region 23a, similarly to the semiconductor range-finding element pertaining to the first and third embodiments, it is possible to ignore the dark currents generated in the first floating diffusion region 23b and the second floating diffusion region 23a. Moreover, the correlated double sampling circuit provided in the column can be used to cancel the reset noise that is generated in the first floating diffusion region 23b and the second floating diffusion region 23a. Hence, a lower noise performance is achieved, and the distance resolution in low illumination regime is improved.

Also, in the semiconductor range-finding element pertaining to the fourth embodiment, because the first floating diffusion region 23b and the second floating diffusion region 23a are connected to a common read-out transistor, the number of the transistors assigned in each pixel can be decreased. Also, when the charge detection is carried out in the same diffusion layer, the characteristics such as the conversion gain and the like can be made equal, thereby improving the precision.

Moreover, when the semiconductor range-finding elements pertaining to the fourth embodiment are arrayed in the shape of the two-dimensional matrix shown in FIG. 1, because the semiconductor range-finding element can be manufactured with a lower fabrication cost and a simple structure to achieve a higher distance resolution, it is possible to manufacture a TOF type range-finding image sensor, in which a large number of pixels are arranged so as to achieve a high space resolution.

By the way, the solid-state imaging device pertaining to the fourth embodiment may be designed with a scheme of two read-out amplifier systems, each of the systems assigned to the first floating diffusion region 23b and the second floating diffusion region 23a, by which the reading-out operations are executed in parallel, is advantageous from the viewpoint of the read-out speed. Although the read-out timing differs from FIG. 7 and the configuration of the noise canceling circuit differs from FIG. 1, only a change such that the two signals can be sampled simultaneously is required to perform the scheme of the two read-out amplifier systems.

Also, the structure may be employed in which the pixel size is doubled, and the transferring structure, accumulating structure and read-out mechanism for the background signal are provided on the left side of the structure shown in FIG. 14, and the signal resulting from the background light is read out. When such structure is used to suppress the influence of the background light, the shot noise caused by the background-light charges can be suppressed, thereby achieving a high distance measurement precision (distance resolution) and the maximal distance measurement range. In particular, in each of the pixels, when the background-light charges are protected from being accumulated in the first buried charge-transfer region 27b and the second buried charge-transfer region 27a, it is possible to use full capacities of the first buried charge-transfer region 27b and the second buried charge-transfer region 27a so as to accumulate the signal charges. Hence, the wide dynamic range can be attained. Moreover, when the dynamic range is represented by the maximal value of the signals and the noise level, the noise caused by the background-light charges is decreased, thereby increasing the dynamic range.

Another Embodiments

While the present invention is described in accordance with the aforementioned first through the fourth embodiments, it should not be understood that the description and drawings that implement a part of the disclosure are to limit the scope of the present invention. In view of aforementioned disclosure, it will be clear that there are a variety of alternative embodiments, examples and operational techniques for those skilled in the art.

In the description of the first to fourth embodiments as mentioned above, the TOF type range-finding image sensor as the two-dimensional solid-state imaging device (area sensor) has been exemplified. However, the semiconductor range-finding elements of the present invention should not be limitedly construed as elements that will be used only for the pixels of the two-dimensional solid-state imaging device. For example, when j=m=1 is defined in the two-dimensional matrix shown in FIG. 1, the configuration in which a plurality of semiconductor range-finding elements are one-dimensionally arrayed as the pixels of the one-dimensional solid-state imaging device (line sensor) will be easily understood from the above-disclosed contents.

Moreover, for the planar pattern shape in the second and third embodiments, it is naturally possible to employ the self-alignment structure in which the first transfer-barrier region 37b, the second transfer-barrier region 37a, the first charge-read-out barrier region 38b and the second charge-read-out barrier region 38a of the first conductivity type (p-type) are buried in the surface buried region 28 of the second conductivity type (n-type) described in the second embodiment.

In this way, the present invention may naturally include various embodiments not described herein. Therefore, the technical scope of the present invention should be defined only by features for specifying the invention according to the appended claims that are regarded appropriate according to the above description.

INDUSTRIAL APPLICABILITY

According to the present invention, it is possible to provide the semiconductor range-finding element that can be manufactured at a low manufacturing cost and excellent in low noise performance which results from the reduction in the dark current and the removal of the reset noise, and the solid-state imaging device that uses the semiconductor range-finding elements as the pixels and has the high distance resolution and space resolution. Thus, the present invention can be applied to the field of a range-finding sensor for a car and the field to obtain or prepare a three-dimensional picture. Moreover, the present invention can be applied even to the field for the operational analysis of a sport player and the game machine in which the three-dimensional picture is used.

The invention claimed is:

1. A semiconductor range-finding element comprising:
a semiconductor layer of first conductivity type;
an island-shaped buried charge-generation region of second conductivity type buried in a part of a surface of the semiconductor layer;
island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region;
an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region;
an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region;
an insulating film covering the semiconductor layer, the buried charge-generation region, the first and second buried charge-transfer regions, and the first and second buried charge read-out regions;
first and second transfer gate electrodes arranged on the insulating film, configured to electro-statically control potentials of transfer channels formed between the buried charge-generation region and the first buried charge-transfer region and between the buried charge-generation region and the second buried charge-transfer region, respectively, through the insulating film, so as to alternately transfer the signal charges to the first and second buried charge-transfer regions; and
first and second read-out gate electrodes arranged on the insulating film, configured to electro-statically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out regions,
wherein a light pulse reflected by a target sample enters as an optical signal in the buried charge-generation region, and in the semiconductor layer just under the buried charge-generation region, the optical signal is converted into the signal charges, and pulse signals are sequentially applied to the first and second transfer gate electrodes in synchronization with the light pulse so that a distance from the target sample is measured in accordance with a distribution ratio of the signal charges accumulated in the first and second buried charge-transfer regions.

2. The semiconductor range-finding element of claim 1, further comprising:
   a first floating diffusion region of the second conductivity type contacting with the first buried charge read-out region, having a higher impurity concentration than the first buried charge read-out region; and
   a second floating diffusion region of the second conductivity type contacting with the second buried charge read-out region, having a higher impurity concentration than the second buried charge read-out region.

3. The semiconductor range-finding element of claim 2, wherein the first and second floating diffusion regions are connected to a common read-out transistor.

4. The semiconductor range-finding element of claim 1, further comprising a light receiving gate electrode disposed on the insulating film just over the buried charge-generation region, configured to be applied with a negative voltage when the buried charge-generation region is n-type.

5. The semiconductor range-finding element of claim 1, wherein a negative pulse is alternately applied to the first and second transfer gate electrodes when the second conductivity type is n-type.

6. A semiconductor range-finding element comprising:
   a semiconductor layer of first conductivity type;
   a surface buried region of second conductivity type buried in a surface of the semiconductor layer;
   island-shaped first and second charge transfer-barrier regions of the first conductivity type buried in a part of a surface of the surface buried region;
   an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region;
   an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region;
   an insulating film covering the surface buried region, the first and second charge transfer-barrier regions, and the first and second charge read-out barrier regions;
   first and second transfer gate electrodes arranged on the insulating film, configured to electro-statically control potentials of transfer channels formed in the first and second charge transfer-barrier regions, respectively, through the insulating film, so as to alternately transfer the signal charges to the first and second potential wells; and
   first and second read-out gate electrodes arranged on the insulating film, configured to electro-statically control potentials of transfer channels formed in the first and second charge read-out barrier regions, respectively, through the insulating film,
   wherein, a light pulse reflected by a target sample enters as an optical signal in the surface buried region between the first and second charge transfer-barrier regions, and in the semiconductor layer just under the surface buried region, the optical signal is converted into the signal charges, and pulse signals are sequentially applied to the first and second transfer gate electrodes in synchronization with the light pulse so that a distance from the target sample is measured in accordance with a distribution ratio of the signal charges accumulated in the first and second potential wells.

7. The semiconductor range-finding element of claim 6, further comprising:
   a first floating diffusion region of the second conductivity type separated by a part of the surface buried region from the first charge read-out barrier region, configured to accumulate the signal charges transferred through the first charge read-out barrier region from the first potential well, having a higher impurity concentration than the surface buried region; and
   a second floating diffusion region of the second conductivity type, configured to accumulate the signal charges transferred through the second charge read-out barrier region from the second potential well, having a higher impurity concentration than the surface buried region.

8. The semiconductor range-finding element of claim 6, further comprising a light receiving gate electrode disposed on the insulating film just over the surface buried region between the first and second charge transfer-barrier regions, configured to be applied with a negative voltage when the surface buried region is n-type.

9. A solid-state imaging device including a plurality of pixels arrayed in a one-dimensional direction, wherein each of the pixels comprises:
   a semiconductor layer of first conductivity type;
   an island-shaped buried charge-generation region of second conductivity type buried in a part of a surface of the semiconductor layer;
   island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region;
   an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region;
   an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region;
   an insulating film covering the semiconductor layer, the buried charge-generation region, the first and second buried charge-transfer regions, and the first and second buried charge read-out regions;
   first and second transfer gate electrodes arranged on the insulating film, configured to electro-statically control potentials of transfer channels formed between the buried charge-generation region and the first buried charge-transfer region and between the buried charge-generation region and the second buried charge-transfer region, respectively, through the insulating film, so as to alternately transfer the signal charges to the first and second buried charge-transfer regions; and first and second read-out gate electrodes arranged on the insulating film, configured to electro-statically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out regions, wherein pulse signals are sequentially applied to the first and second transfer gate electrodes in all of the pixels arrayed in the one-dimensional direction, in synchronization with light pulse, a distance from the target sample is measured in accordance with a distribution ratio of the signal charges accumulated in the first and second buried charge-transfer regions in each of pixels.

10. The solid-state imaging device of claim 9, wherein the pixel further comprises:
   a first floating diffusion region of the second conductivity type contacting with the first buried charge read-out region, having a higher impurity concentration than the first buried charge read-out region; and
   a second floating diffusion region of the second conductivity type contacting with the second buried charge read-out region, having a higher impurity concentration than the second buried charge read-out region.

11. The solid-state imaging device of claim 10, wherein the first and second floating diffusion regions are connected to a common read-out transistor.

12. The solid-state imaging device of claim 9, wherein the pixel further comprises a light receiving gate electrode disposed on the insulating film just over the buried charge-generation region, configured to be applied with a negative voltage when the buried charge-generation region is n-type.

13. The solid-state imaging device of claim 9, wherein, a negative pulse is alternately applied to the first and second transfer gate electrodes when the second conductivity type is n-type.

14. A solid-state imaging device including a plurality of pixels arrayed in a one-dimensional direction, wherein each of the pixels comprises:
   a semiconductor layer of first conductivity type;
   a surface buried region of second conductivity type buried in a surface of the semiconductor layer;
   island-shaped first and second charge transfer-barrier regions of the first conductivity type buried in a part of a surface of the surface buried region;
   an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region;
   an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region;
   an insulating film covering the surface buried region, the first and second charge transfer-barrier regions, and the first and second charge read-out barrier regions;
   first and second transfer gate electrodes arranged on the insulating film, configured to electro-statically control potentials of transfer channels formed in the first and second charge transfer-barrier regions, respectively, through the insulating film, so as to alternately transfer the signal charges to the first and second potential wells; and
   first and second read-out gate electrodes arranged on the insulating film, configured to electro-statically control potentials of transfer channels formed in the first and second charge read-out barrier regions, respectively, through the insulating film,
   wherein, pulse signals are sequentially applied to the first and second transfer gate electrodes in synchronization with light pulse, and a distance from the target sample is measured in accordance with a distribution ratio of the signal charges accumulated in the first and second potential wells in each of the pixels arrayed in the one-dimensional direction.

15. The solid-state imaging device of claim 14 wherein the pixel further comprises:
   a first floating diffusion region of the second conductivity type separated by a part of the surface buried region from the first charge read-out barrier region, configured to accumulate the signal charges transferred through the first charge read-out barrier region from the first potential well, having a higher impurity concentration than the surface buried region; and
   a second floating diffusion region of the second conductivity type, configured to accumulate the signal charges transferred through the second charge read-out barrier region from the second potential well, having a higher impurity concentration than the surface buried region.

16. The solid-state imaging device of claim 14, wherein the pixel further comprises a light receiving gate electrode disposed on the insulating film just over the surface buried region between the first and second charge transfer-barrier regions, configured to be applied with a negative voltage when the surface buried region is n-type.

17. A solid-state imaging device including a plurality of pixels arrayed in a two-dimensional matrix, wherein each of the pixels comprises:
   a semiconductor layer of first conductivity type;
   an island-shaped buried charge-generation region of second conductivity type buried in a part of a surface of the semiconductor layer;
   island-shaped first and second buried charge-transfer regions of the second conductivity type buried in a part of the surface of the semiconductor layer, separated by a part of the semiconductor layer from the buried charge-generation region, configured to accumulate signal charges transferred from the buried charge-generation region;
   an island-shaped first buried charge read-out region of the second conductivity type buried in a part of the surface of the semiconductor layer, separated by a part of the semiconductor layer from the first buried charge-transfer region, to which the signal charges are transferred from the first buried charge-transfer region;

an island-shaped second buried charge read-out region of the second conductivity type buried in a part of the surface of the semiconductor layer, separated by a part of the semiconductor layer from the second buried charge-transfer region, to which the signal charges are transferred from the second buried charge-transfer region;

an insulating film covering the semiconductor layer, the buried charge-generation region, the first and second buried charge-transfer regions, and the first and second buried charge read-out region;

first and second transfer gate electrodes arranged on the insulating film, configured to electro-statically control potentials of transfer channels formed between the buried charge-generation region and the first buried charge-transfer region and between the buried charge-generation region and the second buried charge-transfer region, through the insulating film, so as to alternately transfer the signal charges to the first and second buried charge-transfer regions; and first and second read-out gate electrodes arranged on the insulating film, configured to electro-statically control potentials of transfer channels formed between the first buried charge-transfer region and the first buried charge read-out region and between the second buried charge-transfer region and the second buried charge read-out region, respectively, through the insulating film, so as to transfer the signal charges to the first and second buried charge read-out region, wherein pulse signals are sequentially applied to the first and second transfer gate electrodes, in synchronization with light pulse, and a distance from a target sample is measured in accordance with a distribution ratio of the signal charges accumulated in the first and second buried charge-transfer regions in each of the pixels arrayed in the two-dimensional matrix so that all of the pixels are two-dimensionally accessed, and a two-dimensional picture corresponding to the measured distance is consequently obtained.

18. The solid-state imaging device of claim 17, wherein the pixels further comprises:

a first floating diffusion region of the second conductivity type contacting with the first buried charge read-out region, having a higher impurity concentration than the first buried charge read-out region; and a second floating diffusion region of the second conductivity type contacting with the second buried charge read-out region, having a higher impurity concentration than the second buried charge read-out region.

19. The solid-state imaging device of claim 17, further comprising a light receiving gate electrode disposed on the insulating film just over the buried charge-generation region, configured to be applied with a negative voltage when the buried charge-generation region is n-type.

20. A solid-state imaging device including a plurality of pixels arrayed in a two-dimensional matrix, wherein each of the pixels comprises:

a semiconductor layer of first conductivity type;

a surface buried region of second conductivity type buried in a surface of the semiconductor layer;

island-shaped first and second charge transfer-barrier regions of the first conductivity type buried in a part of a surface of the surface buried region;

an island-shaped first charge read-out barrier region of the first conductivity type buried in a part of the surface of the surface buried region, separated by a part of the surface buried region from the first charge transfer-barrier region, configured to form a first potential well for accumulating signal charges transferred through the first charge transfer-barrier region between the first charge read-out barrier region and the first charge transfer-barrier region;

an island-shaped second charge read-out barrier region of the first conductivity type buried in a part of the surface of the surface buried region, separated by a part of the surface buried region from the second charge transfer-barrier region, configured to form a second potential well for accumulating signal charges transferred through the second charge transfer-barrier region between the second charge read-out barrier region and the second charge transfer-barrier region;

an insulating film covering the surface buried region, the first and second charge transfer-barrier regions, and the first and second charge read-out barrier regions;

first and second transfer gate electrodes arranged on the insulating film, configured to electro-statically control potentials of transfer channels formed in the first and second charge transfer-barrier regions, respectively, through the insulating film, so as to alternately transfer the signal charges to the first and second potential wells; and first and second read-out gate electrodes arranged on the insulating film, configured to electro-statically control potentials of transfer channels formed in the first and second charge read-out barrier regions, respectively, through the insulating film, wherein pulse signals are sequentially applied to the first and second transfer gate electrodes, in synchronization with light pulse, and a distance from a target sample is measured in accordance with a distribution ratio of the signal charges accumulated in the first and second potential wells, in each of the pixels arrayed in the two-dimensional matrix, so that all of the pixels are two-dimensionally accessed, and a two-dimensional image corresponding to the measured distance is consequently obtained.

21. The solid-state imaging device of claim 20, wherein the pixel further comprises:

a first floating diffusion region of the second conductivity type separated by a part of the surface buried region from the first charge read-out barrier region, configured to accumulate the signal charges transferred through the first charge read-out barrier region from the first potential well, having a higher impurity concentration than the surface buried region; and a second floating diffusion region of the second conductivity type, configured to accumulate the signal charges transferred through the second charge read-out barrier region from the second potential well, having a higher impurity concentration than the surface buried region.

22. The solid-state imaging device of claim 21, wherein the pixel further comprises a light receiving gate electrode disposed on the insulating film just over the surface buried region between the first and second charge transfer-barrier regions, configured to be applied with a negative voltage when the surface buried region is n-type.

* * * * *